United States Patent [19]
Jerome et al.

[11] Patent Number: 5,436,496
[45] Date of Patent: Jul. 25, 1995

[54] VERTICAL FUSE DEVICE

[75] Inventors: Rick C. Jerome, Puyallup, Wash.; Ronald P. Kovacs, Mountain View; George E. Ganschow, Trabuco Canyon, both of Calif.; Lawrence K. C. Lam, Kent; James L. Bouknight, Puyallup, both of Wash.; Frank Marazita, San Jose; Brian McFarlane, Campbell, both of Calif.; Ali Iranmanesh, Federal Way, Wash.

[73] Assignee: National Semiconductor Corporation, Santa Clara, Calif.

[21] Appl. No.: 195,901

[22] Filed: Feb. 14, 1994

Related U.S. Application Data

[63] Continuation of Ser. No. 570,131, Aug. 20, 1990, abandoned, which is a continuation-in-part of Ser. No. 248,307, Sep. 21, 1988, abandoned, which is a continuation of Ser. No. 902,369, Aug. 29, 1986, abandoned.

[51] Int. Cl.[6] .................. H01L 29/48; H01L 29/72
[52] U.S. Cl. .................. 257/529; 257/577; 257/751; 257/768; 257/539
[58] Field of Search .......... 357/34, 71, 34, 51, 357/59, 71; 437/162; 257/529, 577, 588, 750, 751, 754, 768, 539

[56] References Cited

U.S. PATENT DOCUMENTS

| | | | |
|---|---|---|---|
| 3,191,151 | 6/1965 | Price | 340/166 |
| 4,080,616 | 3/1978 | Horie | 357/13 |
| 4,491,860 | 1/1985 | Lim | 257/751 |
| 4,584,594 | 4/1986 | Vora et al. | 257/588 |
| 4,624,046 | 11/1986 | Shideler et al. | 357/34 |
| 4,649,409 | 3/1987 | Roppongi et al. | 357/30 |
| 4,651,409 | 3/1987 | Ellsworth et al. | 29/576 |
| 4,700,465 | 10/1987 | Sirkin | 257/751 |
| 4,707,723 | 11/1987 | Okamoto et al. | 357/71 |
| 4,714,951 | 12/1987 | Baudrant et al. | 357/59 |
| 4,727,409 | 2/1988 | Conner et al. | 357/59 |
| 4,804,636 | 2/1989 | Groover, III et al. | 257/413 |
| 4,933,736 | 6/1990 | Conner et al. | 357/50 |
| 5,086,005 | 2/1992 | Hirakawa | 437/162 |
| 5,144,403 | 9/1992 | Chiang et al. | 437/31 |
| 5,144,404 | 9/1992 | Iranmanesh et al. | 257/477 |

FOREIGN PATENT DOCUMENTS

| | | | |
|---|---|---|---|
| 2369652 | 5/1978 | France | |
| 55-107258 | 8/1980 | Japan | 357/71 |

OTHER PUBLICATIONS

Electronic Design, pp. 35-36, by Burshy, Oct. 1982.
Intersil Inc., pp. 202-206, by Brockhoff.
Electronics, pp. 52-55, by Peltzer et al., Mar. 1971.
Lloyd, "Semiconductor Process to Prevent Aluminum Alloying," IBM Technical Disclosure Bulletin, vol. 10, No. 11, Apr. 1968.

*Primary Examiner*—Mark V. Prenty

[57] ABSTRACT

A vertical fuse structure including a lightly-doped shallow emitter 30 provides improved fusing characteristics. The structure includes a buried collector 14, an overlying base 30, and an emitter 44 above the base 30. In one preferred embodiment, the emitter 44 extends about 0.2 microns from the upper surface and has a dopant concentration of about $8 \times 10^{19}$ atoms of arsenic per cubic centimeter at the surface. A lightly doped base region 30 extends for about 0.46 microns below the emitter 44 to the collector 14. The upper surface of emitter 44 includes a metal contact 60. Heating the metal 60/emitter 44 interface to its eutectic melting point using a current or voltage pulse causes the aluminum to short through the emitter 44 to the base 30. Shorting the emitter programs the fuse. A second preferred embodiment uses polysilicon as an interconnecting medium. Mass transport of aluminum atoms through the polysilicon allows aluminum to collect at an interface between the polysilicon and an underlying single crystal silicon layer. Aluminum atoms are supplied from a contact metal. A barrier metal between the contact metal and an underlying polysilicon contact to the emitter is not present. Inhibiting or replacing a $TiSi_2$ layer over the fuse emitter contact provides better reproducible fusing action. PtSi replaces $TiSi_2$ if formed over the fuse emitter contact. Separate fuse base implants for the vertical fuse change BJT parameters for improved fusing characteristics. In still another preferred embodiment, codiffusing N type and P type dopants from the polysilicon emitter contact drops a separate fuse mask. The P type codiffused dopants diffuse ahead of the N type emitter dopants into the single crystal to change the base parameters to provide a decreased gain.

34 Claims, 23 Drawing Sheets

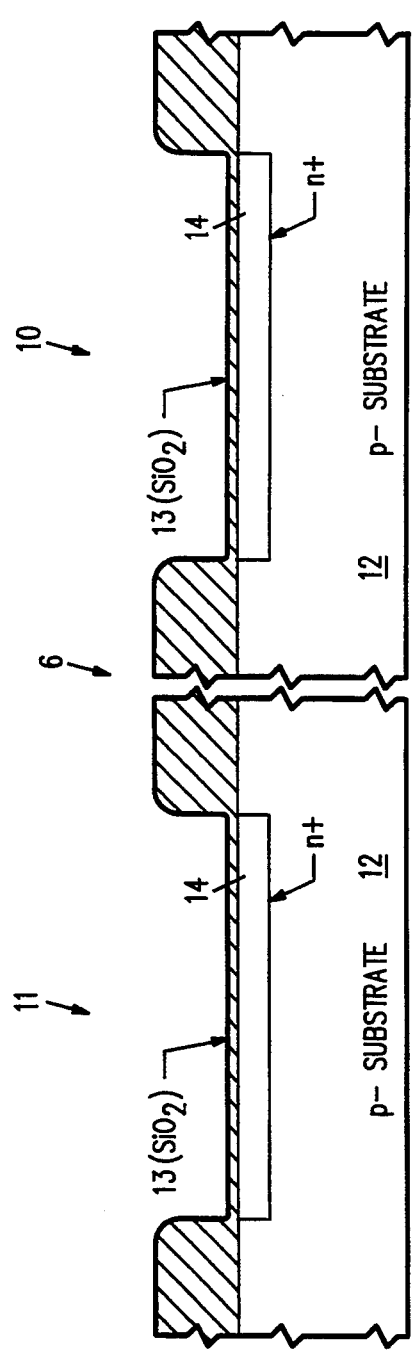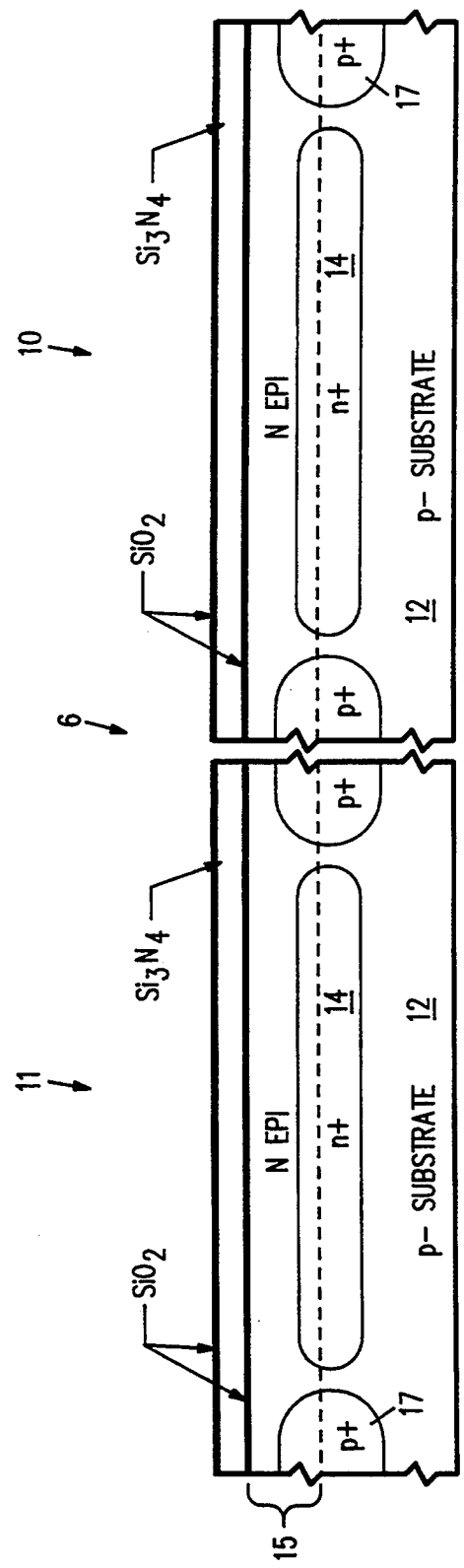

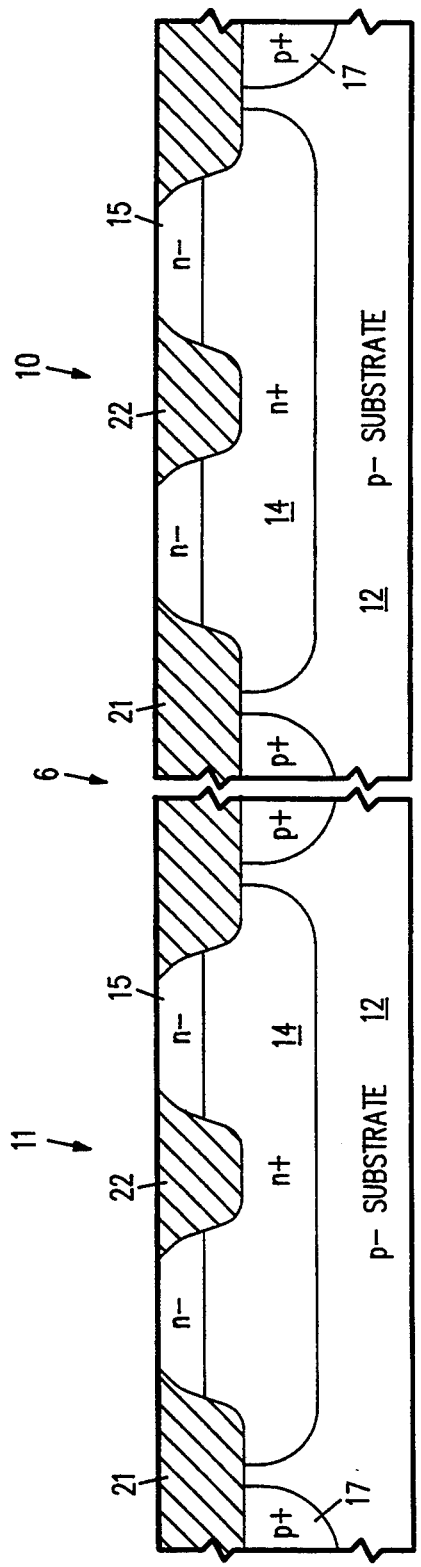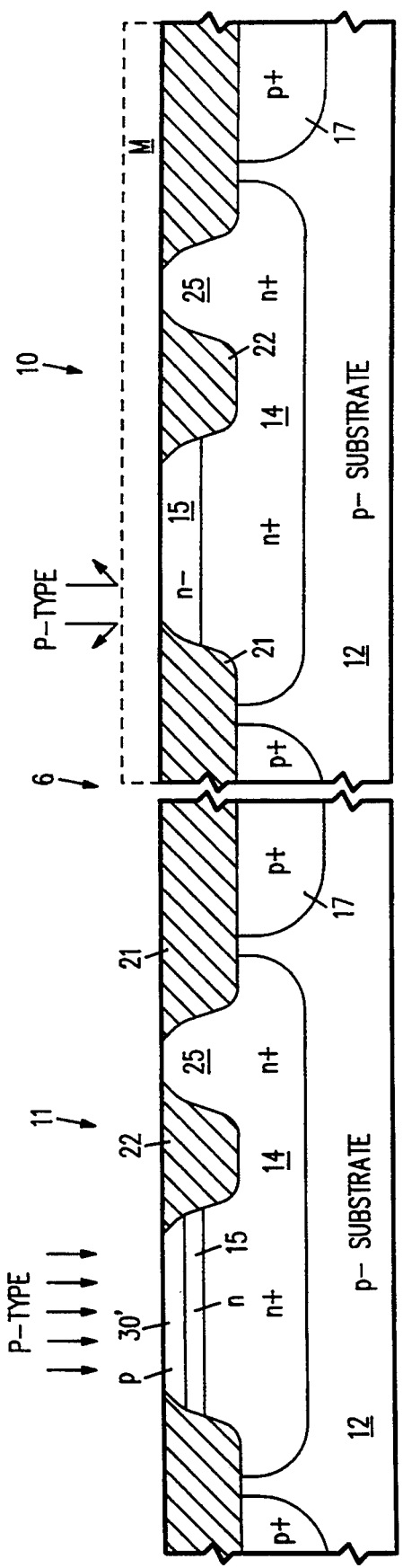
FIG. 2C
FIG. 2D

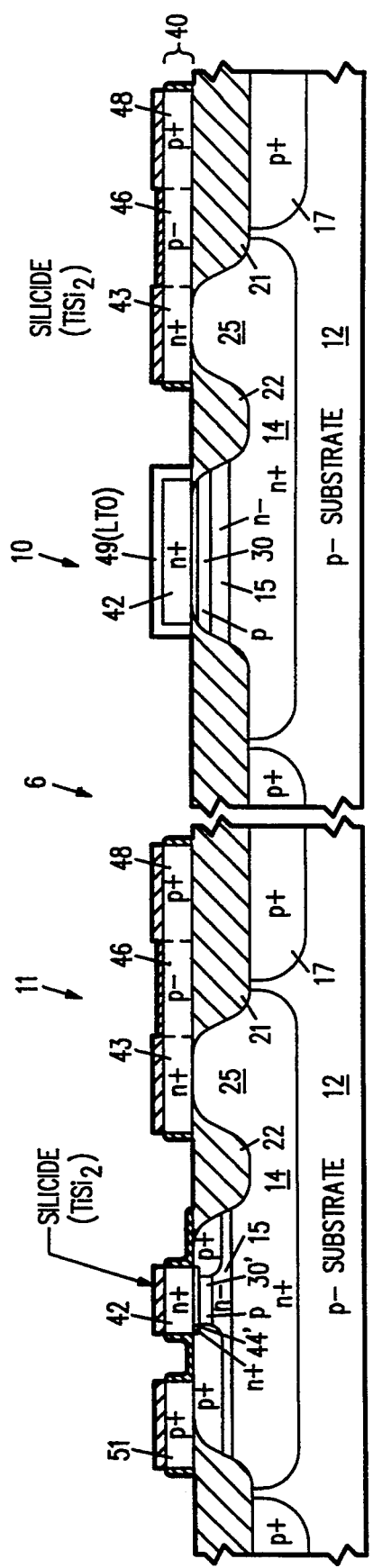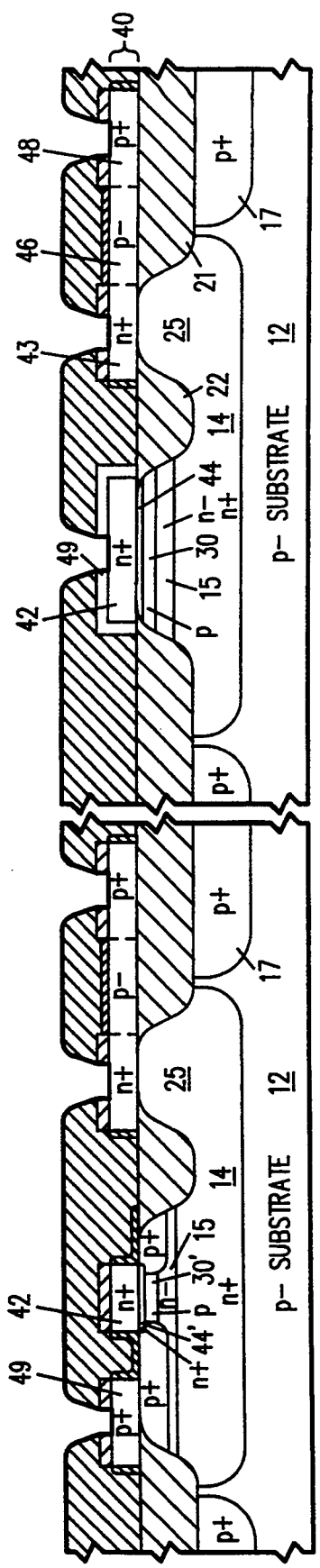
FIG. 2G
FIG. 2H

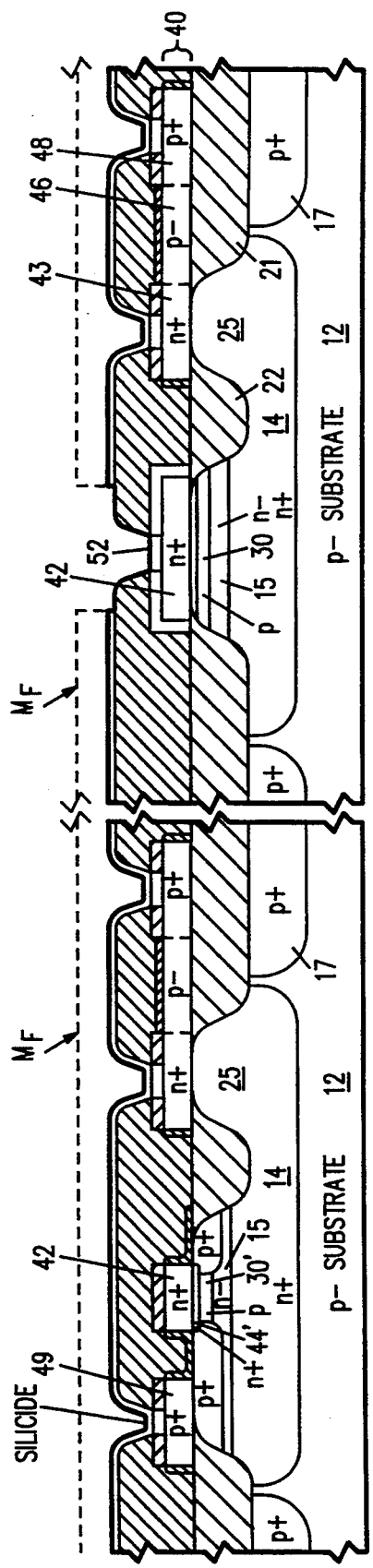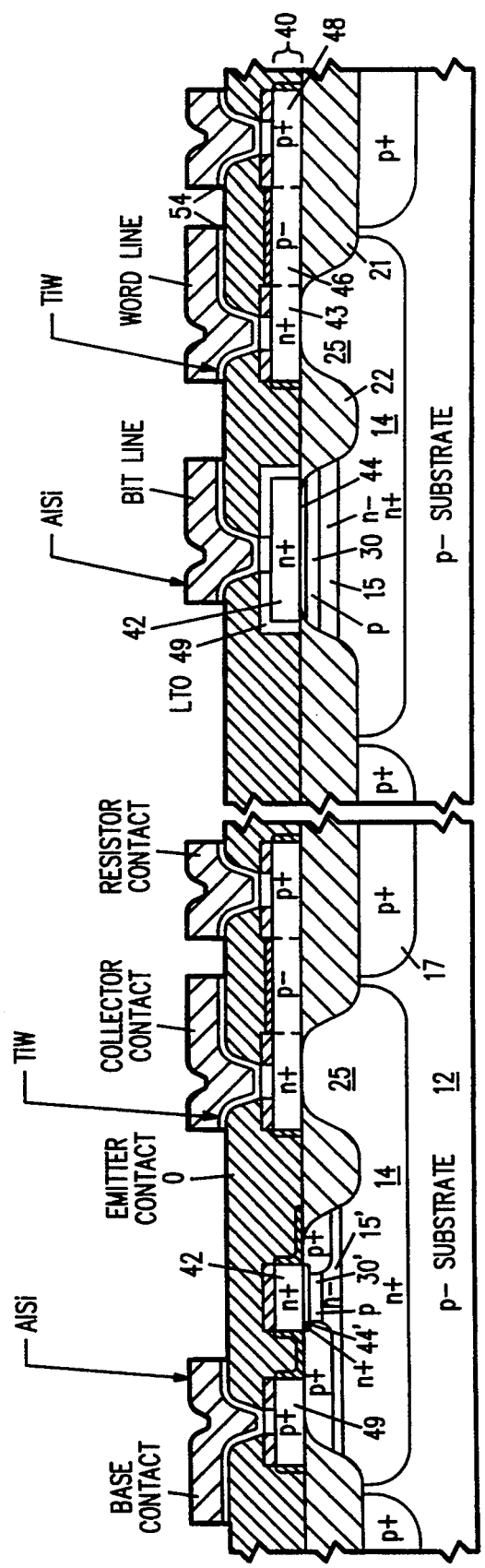

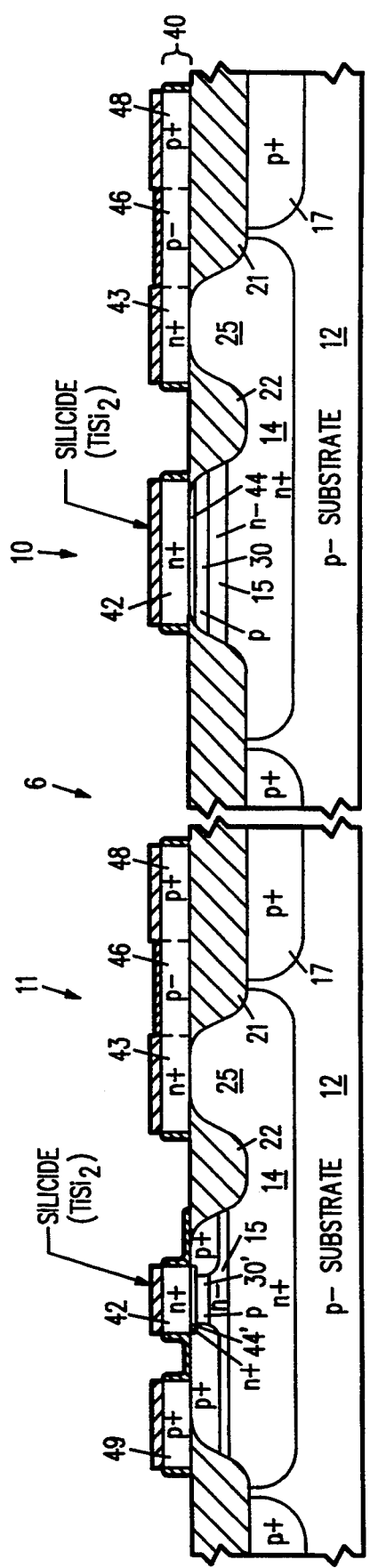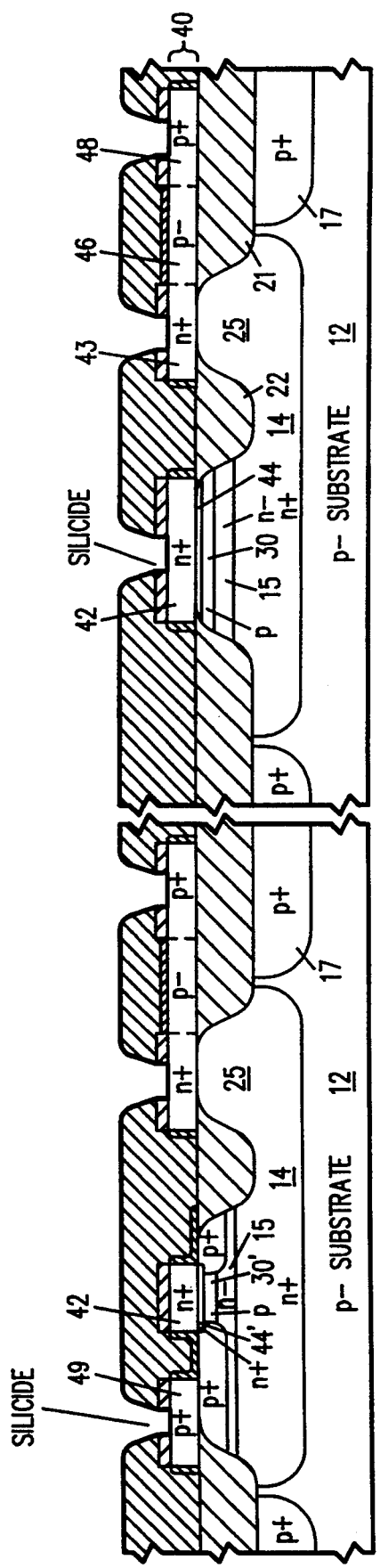
FIG. 2G'
FIG. 2H'

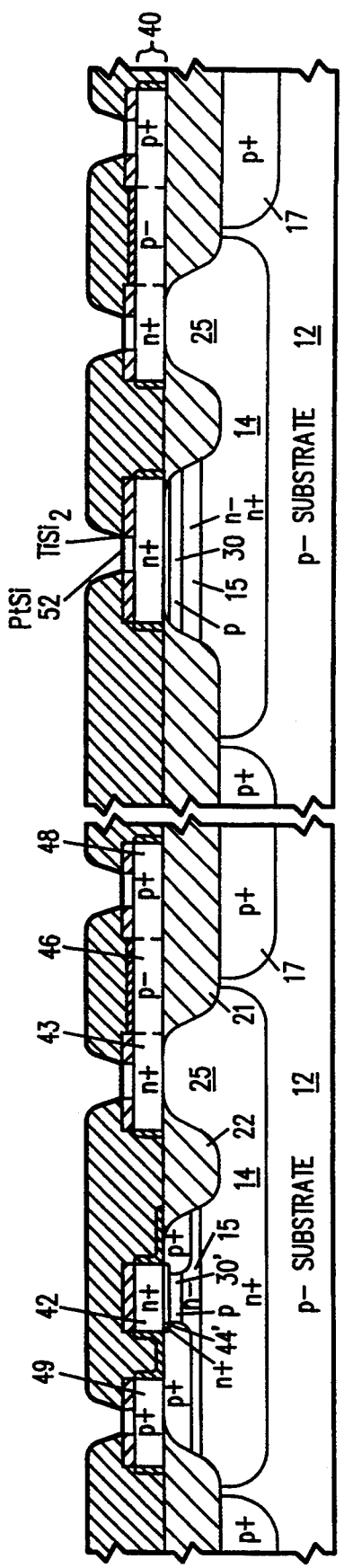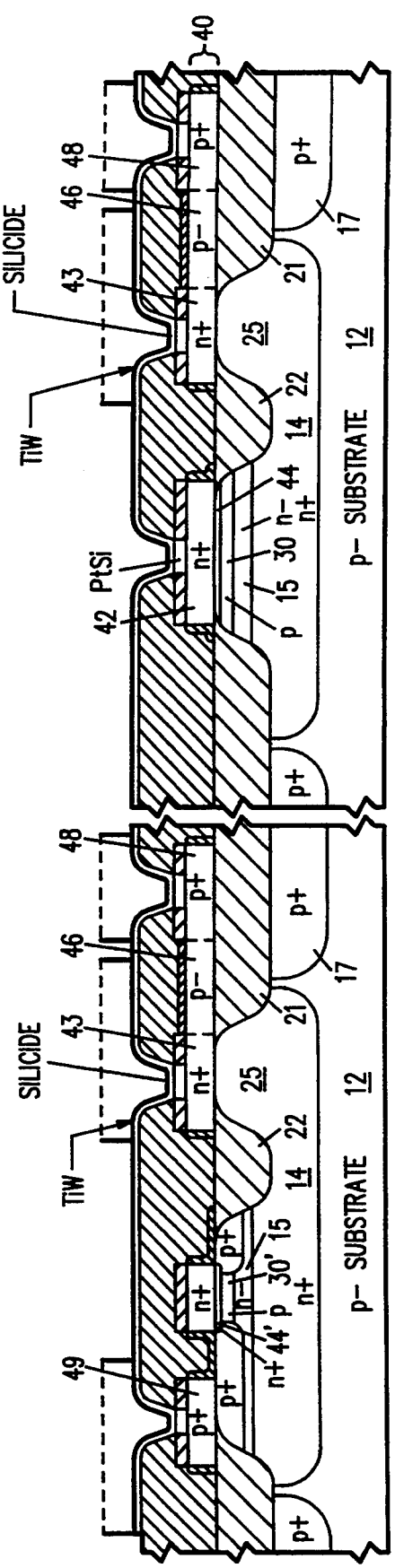

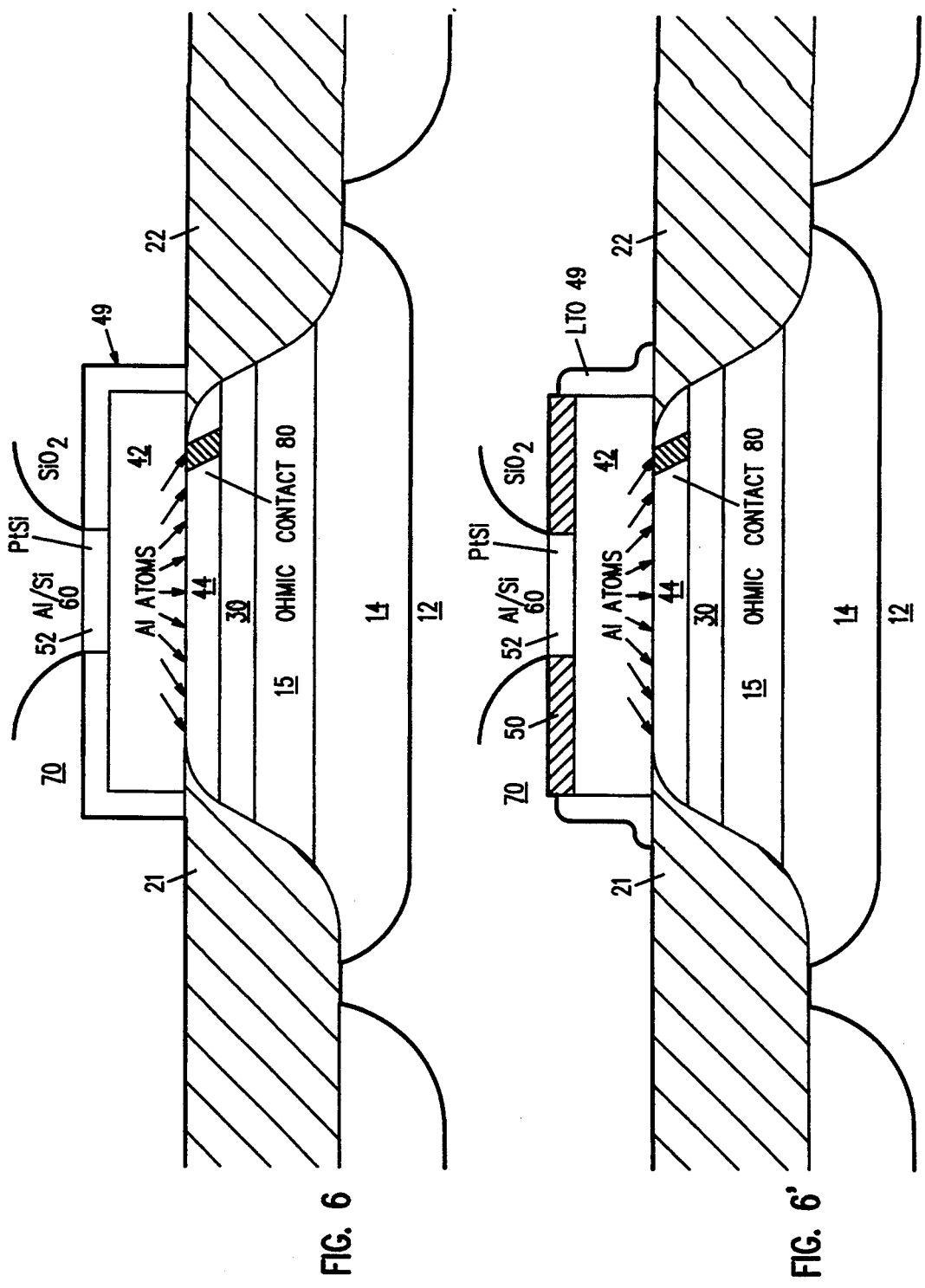

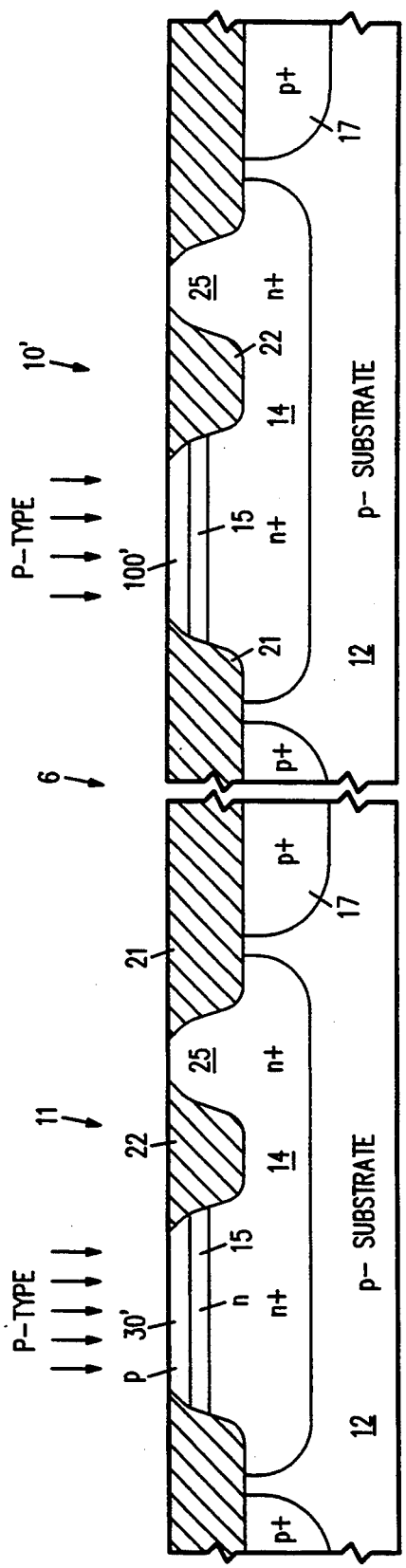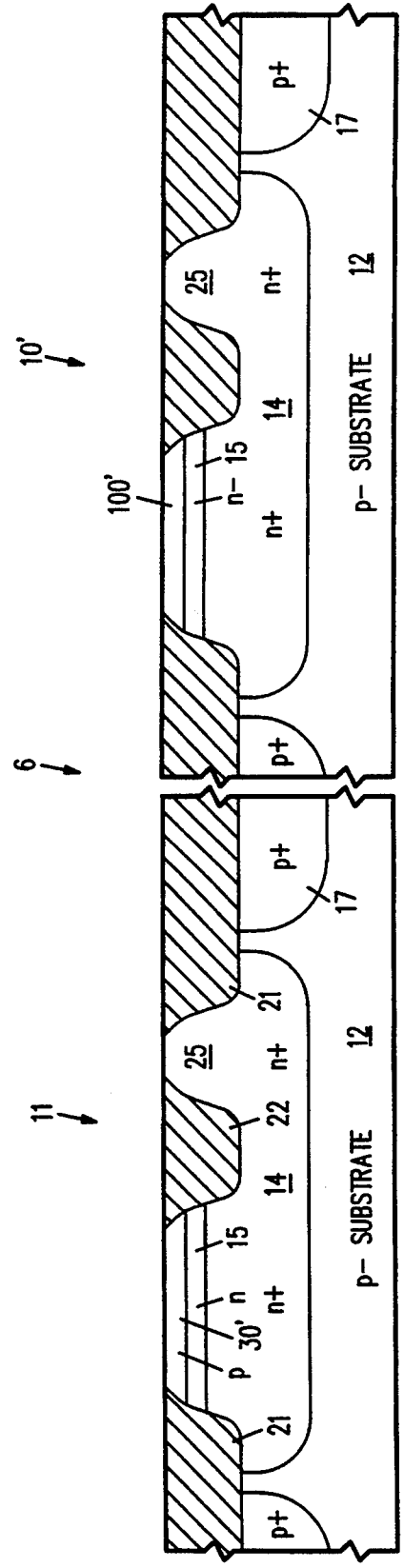
FIG. 9A
FIG. 9B

VERTICAL FUSE DEVICE

CROSS-REFERENCE TO RELATED APPLICATIONS

This is a continuation of Ser. No. 07/570,131, filed Aug. 20, 1990, now abandoned, which is a Continuation-in-Part of Ser. No. 07/248,307, filed Sep. 21, 1988, now abandoned, which is a Continuation of Ser. No. 06/902,369, filed Aug. 29, 1986, now abandoned.

BACKGROUND OF THE INVENTION

This invention relates to fabrication of bipolar junction transistors (BJTs) particularly adapted for fusing capability. Specifically, the invention relates to a BJT vertical fuse having a low dose emitter in a thin epitaxial layer. The invention also relates to a fabrication of BJT vertical fuse when processing methods interpose polycrystalline silicon (polysilicon) between a fuse contact and an emitter.

Douglas Peltzer, in U.S. Pat. No. 3,648,125, provides an example of a process for an oxide isolated BJT integrated circuit. The Peltzer patent is expressly incorporated by reference for all purposes. Many integrated circuits include some type of fusing structure. The fuse structure provides an ability to permanently switch or alter some aspect of an integrated circuit's function after fabrication. These fuse structures may either be lateral or vertical. Lateral fuses extend horizontally across a die's surface, thereby taking up valuable area. Vertical fuses are relatively space efficient in that the fusing areas overlie one another.

A vertical fuse may be a modified BJT. The typical BJT includes a collector region disposed in a substrate. A base region overlies the collector region and an emitter region overlies the base region. Polysilicon, aluminum, or aluminum alloy contacts, interconnect various structures of the integrated circuit. Special procedures used during processing ensure that each collector, base and emitter region has a low resistance path to the surface, allowing the metal contact to communicate with each of them. Vertical fuses are floating base BJTs. A floating base BJT is a BJT that dispenses with contact to the base region.

Programming a vertical fuse, that is "blowing the fuse", results from reverse biasing the floating base BJT. The reverse bias current generates heat in the vertical fuse. Although not thoroughly understood, one possible explanation of the fusing action is that the generated heat is sufficient to raise the temperature of the emitter to about 550° C. 550° C. is the eutectic point for aluminum and silicon. At the eutectic point, silicon from the emitter and aluminum from the contact form a liquid which flows into a void created by the solution of the silicon into the aluminum. After programming, the void extends completely through the emitter producing a low ohmic contact to the base region from the aluminum contact. The low ohmic contact shorts the emitter and effectively provides a diode structure after programming. This change of the vertical fuse from a floating base transistor to a diode is detectable by external circuitry. Providing an array of the fuses and selectively programming particular ones of the fuses can produce a programmable read only memory (PROM) or a programmable array logic (PAL) device, for example. Assignment of an unprogrammed fuse with a value of "0" and a programmed fuse with a value of "1" provides for the PROM or the PAL device. Thus, the vertical fuse's greater packing density allows a use of large arrays with small die areas, contributing to the vertical fuse's use in PROMs and PAL devices.

Two problems which develop by use of conventional BJTs in production of dense fuse arrays include overblowing and crosstalk. Overblowing occurs when the ohmic contact not only extends through the emitter region, but also extends through the base region. This overblow produces an irreversible Schottky diode which functions differently from the programmed fuse. Formation of a Schottky diode results in a leaky device which has different forward characteristics that tend to be unrepeatable. An access of the Schottky diode may provide too much or too little current, and may not function in the device.

Crosstalk is the term coined for two fuses interfering with one another. For example, programming a first fuse of an array may prevent programming of a second adjacent fuse if crosstalk is excessive.

A conventional BJT's design minimizes switching speed and maximizes transistor gain ($\beta$). This design includes thin basewidths which provide in turn, relatively high fuse series resistance ($R_s$), high $\beta$, low open-base breakdown voltage between the collector and the emitter ($BV_{ceo}$) and low open-base breakdown voltage between the emitter and the collector $BV_{eco}$. Conventional BJTs typically have $\beta$'s greater than about 100–150, with $BV_{ceo}$ of about 6–8 volts and $BV_{eco}$ of about 2–2.5 volts These values are, unfortunately, unacceptable for optimal fusing action. Fuses desirably have a $BV_{eco}$ of greater than about 8 volts, with 10–12 volts preferred, and a $BV_{eco}$ between about 3.0 and 3.6 volts. Beta's less than about 10, and more preferably less than about 5, are desirable.

Thus, conventional BJT's do not have optimal performance parameters to promote their programmability when configured as a fuse. Providing for acceptable floating base BJTs encounters further difficulties upon consideration of the processing environment for these devices. For integrated circuits, processing forms hundreds of thousands to millions of transistors at one time. Usually, only a relatively small number of these transistors are to become fuses. The fuses must therefore, be made alongside conventional BJTs with minimal processing impact upon the conventional BJTs. That is, changes made to the processing to provide improved fuses must not degrade the performance of the non-fuse BJTs.

An additional problem with manufacture of vertical fuses results from use of polysilicon as an interconnecting medium. U.S. Pat. No. 4,764,480 issued Aug. 16, 1988 to Vora illustrates use of polysilicon as an interconnecting medium to provide contacts to desired active areas of an integrated circuit. The Vora patent is hereby expressly incorporated by reference for all purposes. A BJT made with a process using polysilicon typically has an epitaxial layer grown over a doped substrate. The doped substrate provides the collector region and an implant or diffusion into the epitaxial layer provides the base region. A polysilicon layer grown over the epitaxial layer receives dopants, some of which are driven into the underlying epitaxial layer to form an emitter and a collector sink. The doped regions of the polysilicon form ohmic contacts to which one or more metal layers provide necessary contacts to the active structures of the BJT. These polysilicon ohmic contacts are called emitter contacts if they overly emitter region in the epitaxial layer. The polysilicon layer separates the aluminum-containing metal contact and the emitter formed in the epitaxial layer. This separation makes conventional fusing action difficult to initiate. Implementation is especially difficult when it is necessary to preserve fast transistor characteristics for non-fuse BJTs proximate the vertical fuse BJTs and to minimize the impact on the processing sequences to develop the integrated circuit structures.

Fusing is difficult after use of polysilicon as an interconnecting medium because the temperature at which polysilicon becomes molten is about 1415° C. Thus, melting the layer of polysilicon during programming would generate so much heat that damage to the device results.

From the above it is seen that improved vertical fuses and a method of fabrication thereof are desired.

SUMMARY OF THE INVENTION

The invention includes a process for developing a novel vertical fuse with reduced programming power requirements that programs more reliably than prior art fuses. The process includes a modularized processing sequence for formation of vertical fuses as part of an overall manufacturing process incorporating both conventional BJTs and metal oxide semiconductor ("MOS") devices. The modularized processing sequence produces the vertical fuses on the same die as conventional devices, without adverse impact on the operation or ability to manufacture the conventional devices.

In a preferred embodiment of a vertical fuse structure, changes to thicknesses of emitter regions and base regions provide a desirable fusing configuration. Providing a fuse BJT with a very shallow emitter region and with a relatively thick base region contributes to desirable fusing action. Changing the active dopant concentration levels of the emitter and the base regions promotes fusing action and reduces cross-talk.

A first preferred embodiment of a vertical fuse structure includes a buried first conductivity type collector region under a first conductivity type epitaxial region. This first preferred embodiment is a non-polysilicon implementation. A second conductivity type base region, simultaneously formed with high current-gain bipolar junction transistors, overlies the collector region. A lightly doped region of first conductivity type dopants formed in the base region provides a shallow emitter. Production of the improved fuse does not require more masking operations than prior art fuse processes. The emitter extends to a surface of a wafer and preferably has a dopant concentration of less than $1 \times 10^{20}$ atoms of arsenic per cubic centimeter at the surface. The resulting fuse programs at a lower current than previously obtainable and is adaptable for thin epitaxial layers.

Production of the vertical fuse with large area emitter region areas provides higher resistance to problems caused in solid phase epitaxial growth. The unprogrammed fuse is resistant to becoming pre-programmed during various heat treatments used in fabrication. Pre-programming is the term developed for the undesirable event when fabricated fuses are produced in an irreversible programmed condition.

A second preferred embodiment of the present invention includes BJT processes using polysilicon as a connecting medium. Provision of aluminum atoms in "diffusible communication" with shallow fuse emitters, and independent modification to fuse base characteristics produces a preferred vertical fuse device. "Diffusible communication" as used herein, includes modification of conventional metallization steps to eliminate the barrier metal from between the contact metal and the polysilicon fuse emitter contact. Accordingly, contact metal such as aluminum, is in direct contact with a silicide overlying the polysilicon emitter contact on vertical fuses. However, a barrier metal separates contact metal from the polysilicon emitter contacts of BJTs.

Provision of an independent masking operation independently modifies fuse base characteristics in one embodiment. This additional masking operation affects the fuse base regions without affecting BJT base regions. According to one embodiment, polysilicon fuse emitter contacts have a lateral dimension completely overlapping the underlying fuse base regions that extend to the field oxide regions surrounding the base region. This overlapping emitter contact prevents extrinsic base implants used for other non-fuse active regions from changing the fuse base.

In some embodiments, conventional BJTs made with polysilicon have a layer of titanium silicide ($TiSi_2$) formed above the emitter contact. A barrier metal, such as titanium tungsten (TiW) lies between aluminum-containing contact metal and the silicide overlying the emitter. In a preferred embodiment of the invention herein, removal of the barrier metal overlying the polysilicon emitter contact places aluminum atoms in diffusible communication with the emitter of the fuse. While aluminum atoms diffuse through the $TiSi_2$, increased incidence of pre-programmed vertical fuses occurs when significant amounts of $TiSi_2$ are present above the fuse emitter contact. A preferred embodiment removes $TiSi_2$ from above the fuse emitter contacts to reduce pre-programming incidence. The invention provides two alternate preferred methods of forming polysilicon fuse emitter contacts without an overlying layer of $TiSi_2$. In a first embodiment, $TiSi_2$ exclusion prevents all $TiSi_2$ formation above the fuse emitter contacts. In a second embodiment, a second silicide replaces significant amounts of $TiSi_2$ over the fuse emitter contacts such as, for example, platinum silicide, PtSi.

$TiSi_2$ exclusion and $TiSi_2$ replacement along with removal of the barrier metal are both preferred methods of putting contact metal in diffusible communication with the polysilicon to promote fusing characteristics.

Reference to the following description and drawing realizes a further understanding of the nature and advantages of the invention.

BRIEF DESCRIPTION OF THE DRAWINGS

FIG. 1' is a cross sectional view of another preferred embodiment of a vertical fuse 1 with silicide formed over emitter contact 42;

FIGS. 2A through 2M are cross sections of a concurrent fabrication of a vertical fuse device embodying the present invention alongside a conventional BJT. Specifically:

FIG. 2A is a cross section of a die 6 divided into two areas;

FIG. 2B is a cross section of die 6 illustrated in FIG. 2A after a buried layer anneal step and a field implant step;

FIG. 2C is a cross section of die 6 after formation of isolation islands and operation of a bird's head planarization process;

FIG. 2D is a cross section of die 6 after application of a sink mask and a sink implant step, followed in turn by a base mask and base implant;

FIG. 2E is a cross section of die 6 with fuse mask $M_F$ overlaying fuse device 10 and BJT 11;

FIG. 2F is a cross section of die 6 with a layer 40 of polycrystalline silicon ("polysilicon") deposited over its entire surface;

FIG. 2G is a cross section of die 6 after defining and etching polysilicon layer 40;

FIG. 2H is a cross section of die 6 after oxidation by a chemical vapor deposition ("CVD") process, followed by planarization etchback/CVD cap and contact mask/etch processes;

FIG. 2I is a cross section of die 6 before contact metallization;

FIG. 2J is a cross section of die 6 with a barrier metal 54 deposited over its entire surface;

FIG. 2K is a cross section of die 6 after removal. Barrier metal 54 and LTO 49 by a wet $NH_4OH:H_2O_2$ TiW process;

FIG. 2L is a cross section of die 6 with exposed polysilicon emitter contacts 42;

FIG. 2M is a cross section of die 6 with a finally formed fuse device 10 and BJT 11 on the same die 6; and FIGS. 2G' through 2L' are cross sections of selected steps of an alternate process illustrated by changes to the processes depicted by the cross sections of FIGS. 2G–2M which are used when a silicide overlies emitter contact 42, as illustrated in FIG. 1. Specifically:

FIG. 2G' is a cross section of die 6 after defining and etching polysilicon layer 40;

FIG. 2H' is a cross section of die 6 after oxidation by a chemical vapor deposition ("CVD") process, followed by planarization etchback/CVD cap and contact mask/etch processes;

FIG. 2I' is a cross section of die 6 having a PtSi layer 52 formed over a portion of emitter 44 of fuse device 10 and replacing the removed $TiSi_2$;

FIG. 2J' is a cross section of die 6 with a barrier metal 54 deposited over its entire surface;

FIG. 2K' is a cross section of die 6 after removal of barrier metal 54 by a wet $NH_4OH:H_2O_2$ TiW removal process;

FIG. 2L' is a cross section of die 6 with exposed polysilicon emitter contacts 42;

FIG. 2M' is a cross section of die 6 having finally formed fuse device 10, as illustrated in FIG. 1', and BJT 11 on the same die 6;

FIG. 6 is a cross section of the programmed fuse showing a shorted emitter/base junction;

FIG. 8' is a cross section view of another preferred embodiment of a codiffused vertical fuse BJT device with platinum silicide formed over a polysilicon emitter contact; and FIGS. 9A–9C represent respectively, modified FIGS. D, 2E, and 2F, which include steps required for processing to produce codiffused vertical fuse 10'. Specifically:

FIG. 9A is a cross section of die 6 having a sink mask (not shown) and sink implant step performed;

FIG. 9B is a cross section of die 6 with a null operation, expressly elaborating that no provision is made for separate fuse base mask and implant steps illustrated by FIG. 2E;

FIG. 9C is a cross section of die 6 having a layer of polycrystalline silicon ("polysilicon") deposited over an entire surface of die 6;

DETAILED DESCRIPTION OF THE PREFERRED EMBODIMENT CONTENTS

I. Polysilicon Embodiments
    A. $TiSi_2$ Exclusion
    B. $TiSi_2$ Replacement
II. Polysilicon Process
    A. $TiSi_2$ Exclusion
    B. $TiSi_2$ Replacement
III. Polysilicon Fuse Performance
IV. Codiffused Embodiments
    A. $TiSi_2$ Exclusion
    $TiSi_2$ Replacement
V. Non-Polysilicon Embodiment
VI. Conclusion

I. Polysilicon Embodiments

Figure 1:
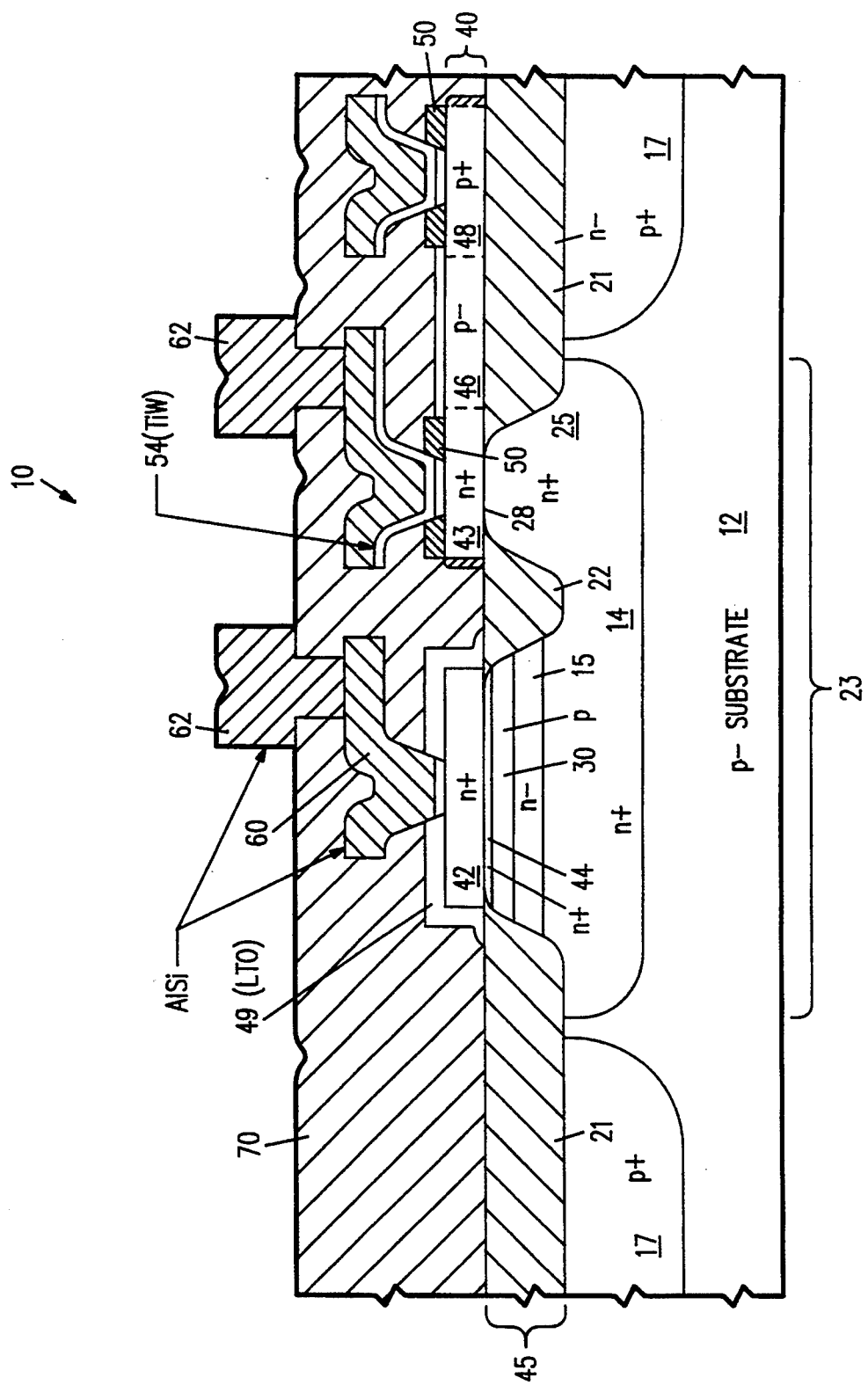
FIG. 1 is a cross sectional view of a preferred embodiment of a semiconductor fuse device 10 using polysilicon.
Figure 1:
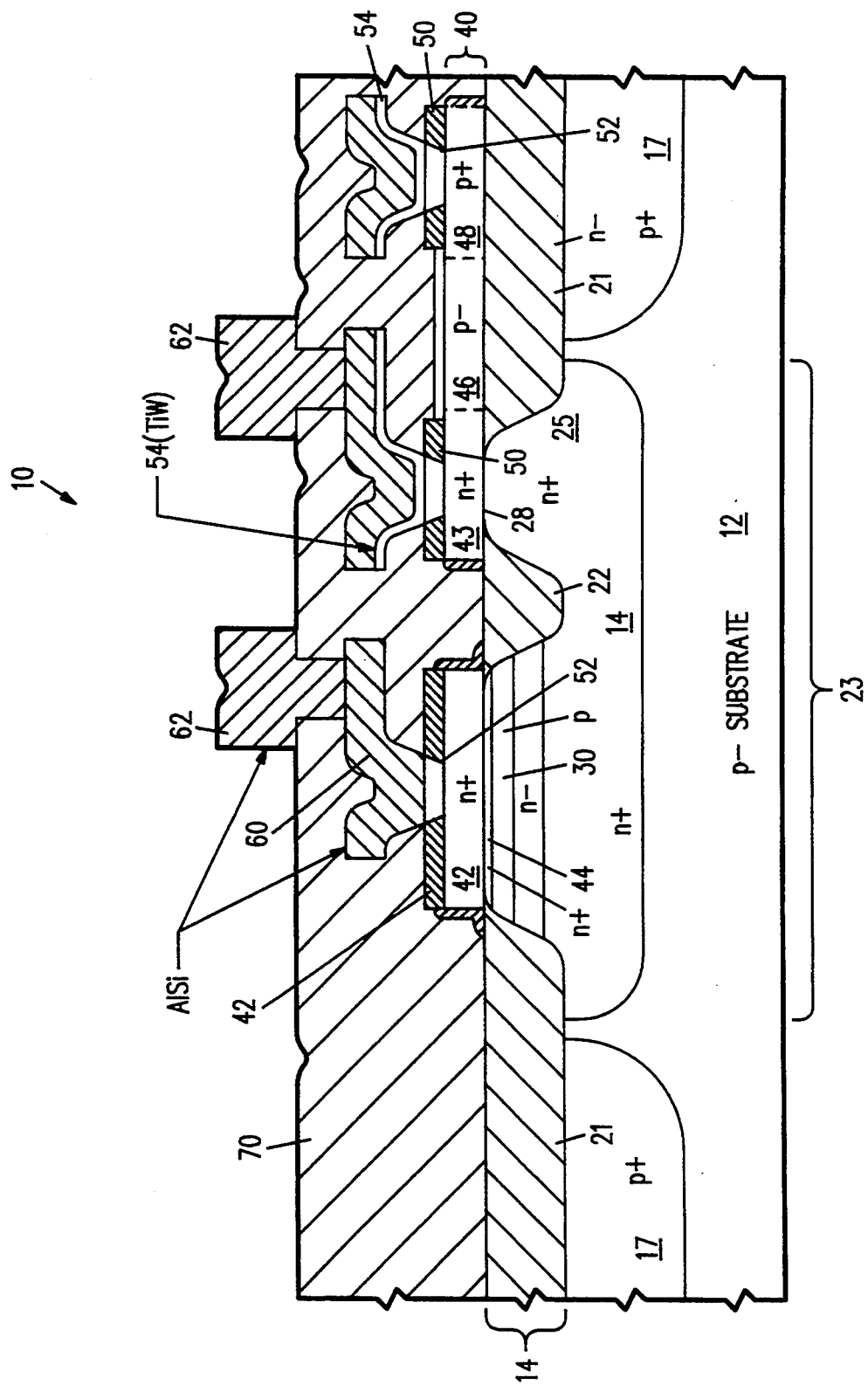

FIG. 1 is a cross sectional schematic of a preferred embodiment of a semiconductor fuse device 10 using polysilicon contacts. Fuse device 10 includes a P conductivity type silicon substrate 12 doped with boron, in a preferred embodiment, to a predetermined resistivity. The predetermined resistivity is process dependent and will vary. Merely as examples, for a first process type, for example a process similar to Fast-Z used by National Semiconductor, the resistivity value is about 1 to 3.5 ohms. centimeter ("Ω.cm"). Recommended values for a second process type, for example the Aspect II process, are about 10–18 Ω.cm while the values for a third process type, for example an ASPECT III processs as used by National Semiconductor are about 30–40 Ωcm. A buried layer 14 functioning as a collector, extends into substrate 12. Arsenic atoms dope the collector to a peak concentration of about $1 \times 10^{19}$ to about $5 \times 10^{19}$ atoms per cubic centimeter (atoms/$cm^3$). A thin N type epitaxial layer 15 of monocrystalline silicon overlies the upper surface of the substrate 12 and buried layer 14. Epitaxial layer 15 has an approximate thickness which is also process dependent. The first process type grows an epitaxial layer having a thickness of about 1.2 microns to 1.5 microns, preferably 1.3 microns. The second process type grows the epitaxial layer to about 1.3 microns and the third process type to about 1.1 microns.

A channel stop implant 17 prevents channel inversion at the silicon dioxide/silicon interface proximate to field oxide regions. A fully recessed field oxide region 21 provides isolation for fuse device 10. Field oxide region 21 is rectilinear and surrounds an island 23 of epitaxial silicon 15, providing an electrically-isolated pocket. Active and passive devices within the pocket are isolated and operate relatively free of interference with other cells. A second field oxide 22 separates a collector sink 25 from a remainder of the transistor. Heavily doped collector sink 25 has N type dopants, typically with an active chemical dopant concentration of about $1 \times 10^{17}$ to about $1 \times 10^{20}$ atoms/cm$^3$ of phosphorous, providing ohmic continuity to buried layer 14 from a surface 28. A sheet resistance of collector sink 25 is typically about 10 Ω/square to about 20 Ω/square.

A fuse base 30 has an active chemical dopant concentration of a P type dopant of about $5 \times 10^{17}$ to about $5 \times 10^{18}$ atoms/cm$^3$, $1 \times 10^{18}$ preferred, at a depth of about 0.25 microns below the polysilicon-monocrystalline interface. The fuse base 30 has a thickness of between about 0.3 and about 0.5 microns, with about 0.4 microns preferred.

Epitaxial layer 15 has an overlying layer of polysilicon 40 with a thickness of about 4500 Å for the first and second process types. For the third process type, polysilicon layer 40 has an approximate thickness of about 0.32 microns. Select regions of polysilicon layer 40 have active chemical dopant concentrations to serve as contacts or resistive elements, as well known in the art. One of these regions is a polysilicon fuse emitter contact 42 with N type dopant atoms, typically arsenic atoms. The emitter contact 42 has an active chemical dopant concentration of about $1 \times 10^{19}$ to about $1 \times 10^{20}$ atoms/cm$^3$, with about $2 \times 10^{19}$ atoms/cm$^3$ preferred. The polysilicon emitter contact 42 completely covers fuse base region 30 which prevents later extrinsic base implant operations from changing the fuse device. Another select region of the polysilicon layer 40 is a collector sink contact 43 overlying collector sink 25.

N type dopants from fuse emitter contact 42 form an emitter 44 overlying fuse base 30. Emitter 44 extends about 0.07 microns to about 0.12 microns, with about 700–800 Å preferred, into epitaxial layer 15. Emitter 44 has an active chemical dopant concentration at the surface of about $1 \times 10^{20}$ to about $2 \times 10^{20}$ atoms/cm$^3$, with about $1.2 \times 10^{20}$ atoms/cm$^3$ preferred.

A. TiSi$_2$ Exclusion.

A layer of low temperature oxide ("LTO") 49 in the preferred embodiment of the third process type surrounds emitter contact 42 and prevents initial silicide formation over emitter contact 42. For the first and second type processes, a final anneal oxidation prevents this initial silicide formation. Subsequent Schottky compatible processing provides a PtSi layer 52 in any exposed contact openings.

B. TiSi$_2$ Replacement.

FIG. 1 is a cross sectional view of another preferred embodiment of a vertical fuse with silicide formed over emitter contact 42. Other select regions of polysilicon layer 40, polysilicon regions 46 and 48, provide a resistive element and collector contact, respectively. P type dopants lightly dope polysilicon region 46 to an active chemical dopant concentration of about $1 \times 10^{17}$ to $5 \times 10^{18}$ atoms/cm$^3$, with $1 \times 10^{18}$ atoms/cm$^3$ preferred. P type dopants heavily dope polysilicon region 48 to an active chemical dopant concentration of about $1 \times 10^{18}$ to $5 \times 10^{19}$ atoms/cm$^3$, with $1 \times 10^{19}$ atoms/cm$^3$ preferred.

Reacting a refractory metal, for example titanium, over selected areas of polysilicon layer 40 forms an overlying silicide layer 50. Titanium silicide ("TiSi$_2$") forms over these areas of polysilicon layer 40 contacting the refractory metal. Silicide layer 50 has an approximate thickness of about 1200 Å. In the TiSi$_2$ exclusion embodiment, oxide 49 prevents this initial titanium silicide formation over polysilicon emitter contact 42 as shown in FIG. 1. The TiSi$_2$ replacement embodiment provides the PtSi layer 52 as a replacement for a portion of the silicide layer 50 overlying selected polysilicon contacts. The PtSi layer 52 has an approximate thickness of about 500 Å.

Deposited barrier metal 54 (titanium tungsten ("TiW") 10% Ti, 90%W) prevents diffusion of aluminum atoms into underlying areas of the polysilicon layer 40, such as the collector sink contacts. The areas overlying the fuse emitter 44 regions do not have barrier metal 54. A first contact metal layer 60 includes, for example, a mixture of aluminum (Al), silicon (Si) and copper (Cu) deposited over the entire die. The metal layer 60 (metal-1) includes, in one embodiment, Al/Si/Cu in the following relative amounts, by weight: Al—about 93.5% to 100%, 95.1% preferred; Si—about 0.5% to 1.5%, 0.9% preferred; and Cu—0% to 5%, 4% preferred. The metal layer 60 contacts the layer of PtSi. Metal layer 60 over polysilicon region 42 forms, for example, a connection for a bit line of fuse device 10.

A second contact metal layer 62 of Al/Si/Cu coupled to polysilicon region 43 provides, for example, a connection for a word line of fuse device 10. Oxide 70 provides isolation and protection for the structures of fuse device 10.

Fuse base 30 does not have an external connection and "floats" relative to the bit and word lines in the preferred embodiments.

II. Polysilicon Process

FIGS. 2A through 2M are cross sections of a concurrent fabrication of a vertical fuse device embodying a preferred embodiment of the present invention alongside a conventional BJT. FIGS. 2A through 2M produce the TiSi$_2$ Exclusion embodiment of the vertical fuse.

FIGS. 2G' through 2M' are cross sections of selected steps of an alternate process illustrated by changes to the processes depicted by the cross sections of FIGS. 2G-2M. These modified process steps produce the TiSi$_2$ Replacement embodiment of the vertical fuse as illustrated in FIG. 1.

A. Tisi$_2$ Exclusion

FIG. 2A is a cross section of a die 6 divided into two areas, a first preselected area for formation of a fuse device 10 and a second preselected area for formation of a BJT 11. Well known techniques oxidize a P type substrate 12, having a resistivity of about 10 Ω.cm to about 18 Ω.cm, with 10 Ω.cm preferred, producing the initial die 6. Masking, etching and a second oxidization of P type substrate 12 results in a relatively thin implant protection oxide 13 over selected areas. These selected areas have N type dopants implanted through oxide 13 to form a buried layer 14. The implanted N type dopants have a dose of between about $1 \times 10^{15}$ and about $1 \times 10^{16}$ and an implant energy of between about 50 and 100 with about $5 \times 10^{15}$ and 80 preferred. Buried layer implant 14 has a sheet resistance of about 20 to about 30, with 25 $\Omega$/square preferred. Similar implants (not shown) using P+ type dopants form channel stop regions 17.

FIG. 2B is a cross section of die 6 illustrated in FIG. 2A after further processing, including a buried layer anneal step and a field implant step. Temperature cycling anneals buried layer 14 and the field implants 17. A phosphorous doped reduced pressure ("RP") epitaxial silicon layer 15 is thereafter grown and oxidized. The epitaxial layer 15 has an active chemical dopant concentration of about $8 \times 10^{15}$ to about $1.2 \times 10^{16}$ atoms/cm$^3$, with $1 \times 10^{16}$ atoms/cm$^3$ preferred. Epitaxial layer 15 has a resistivity of about 0.45 to about 0.55 $\Omega$.cm, with 0.5 $\Omega$.cm preferred. Epitaxial layer 15 has a thickness of about 1.2 microns to about 1.5 microns, with 1.3 microns preferred. Annealing the field implants result in a channel stop 17 surrounding buried layer 14. Buried layer implant 14 up diffuses into the epitaxial layer about 0.3 microns to about 0.6 microns, with 0.5 microns preferred. Buried layer implant 14 functions as a collector for fuse device 10 and BJT 11.

FIG. 2C is a cross section of die 6 after formation of isolation islands and operation of a bird's head planarization process. An oxide/nitride sandwich deposition, mask and KOH etch followed by a high pressure oxidation (HI POX) procedure forms the isolation islands. Oxide 21 forms a rectilinear region, and oxide 22 divides each rectilinear region into two areas.

FIG. 2D is a cross section of die 6 after application of a sink mask and a sink implant step, followed by a base mask and base implant. Temperature cycling anneals the sink implant to provide sink region 25. Thereafter, mask M shields fuse device 10 while BJT receives an intrinsic base implant. The base implant provides BJT 11 with a base 30' having an active chemical dopant concentration of about $1 \times 10^{17}$ to about $1 \times 10^{18}$ atoms/cm$^3$, with about $1 \times 10^{18}$ atoms/cm$^3$ preferred. The base implant step implants P type dopants using an implant energy of between about 40 and 50 and a dose of between about $2 \times 10^{13}$ and $3 \times 10^{13}$ 49BF$_2$+ ions/cm$^2$ with implant energies of about 45 KeV and doses of about $3 \times 10^{13}$ preferred. This base implant provides a $\beta$ for the BJT transistor in the range of about 80 to about 120. Mask M protects the fuse device 10 from the intrinsic base implant of BJT 11.

Figure 2E:
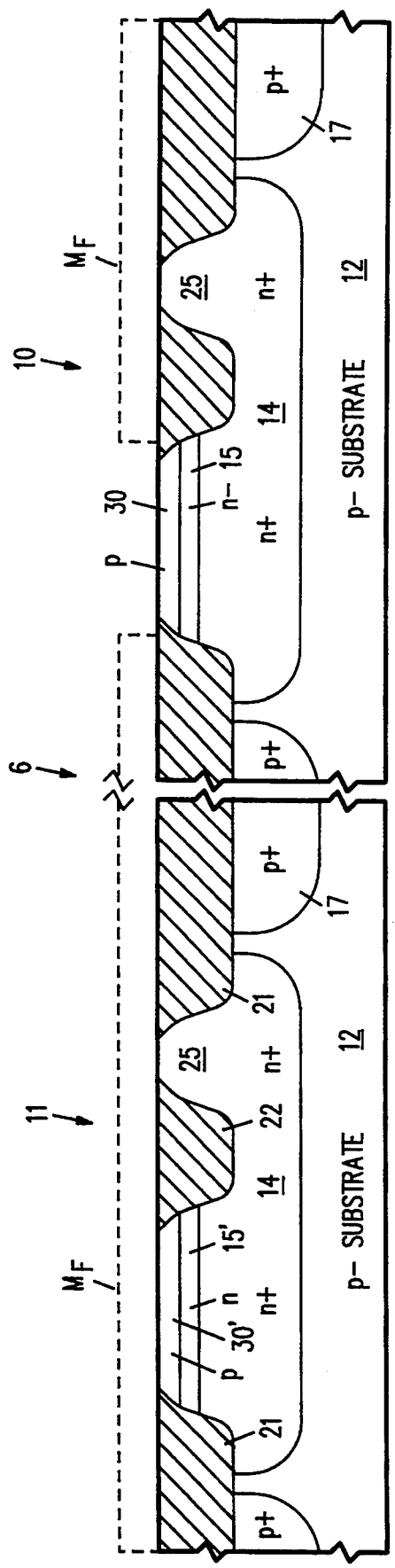

FIG. 2E is a cross section of die 6 with fuse mask M$_F$ overlaying fuse device 10 and BJT 11. A separate fuse base implant provides base 30 with different parameters and characteristics than base 30' of BJT 11, if desired. The separate fuse base implant step implants ions using an implant energy of about 50 to 100 KeV and a dose of $1 \times 10^{13}$ to $5 \times 10^{13}$, with about 70 KeV and $2 \times 10^{13}$ preferred Thus, the two independent masking and implant steps, one for the conventional BJT device and one for the vertical fuse, preferably provides two separate bases. The BJT base 30' is thinner and generally more lightly doped than the fuse base 30.

Figure 2F:
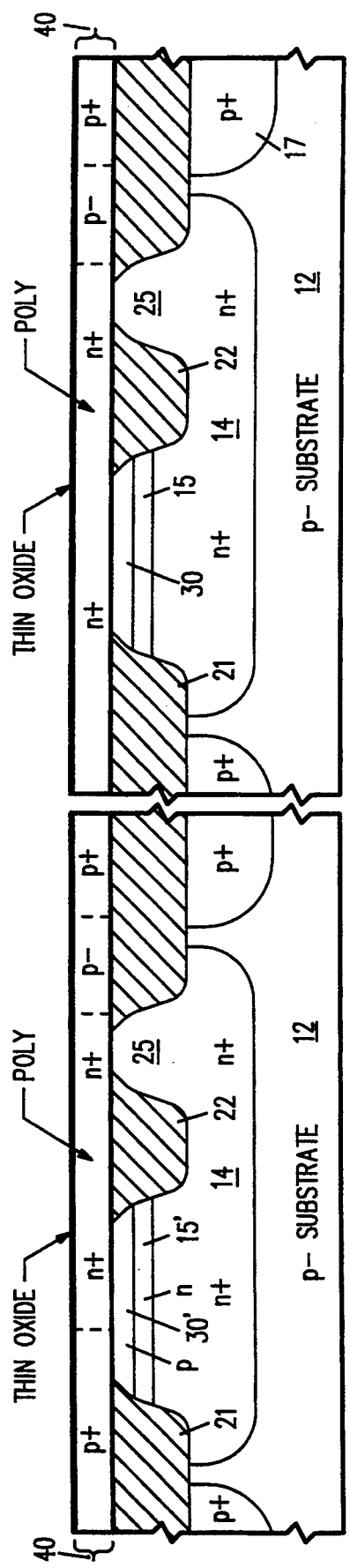

FIG. 2F is a cross section of die 6 with a layer 40 of polycrystalline silicon ("polysilicon") deposited over its entire surface. The polysilicon has a thickness in a range of about 4000 Å–5000 Å, preferably 4500 Å. Polysilicon layer 40 has a thin cap oxide. Oversize masks (not shown) permit formation of select P+, P−, and N+ areas in the polysilicon layer 40 by implanting both P and N type dopants through the cap oxide. The selected P+, P−, and N+ areas correspond to various elements, such as an emitter, base, and collector contact, and any desired resistive elements.

It is desirable to form polysilicon layer 40 with columnar grain boundaries having an average diameter of about 200 Å. Polysilicon grain boundary size is a function of temperature and doping concentration. One possible explanation of the operation of the invention is that it by these grain boundaries that mass transport of conductive metal atoms occurs, although the invention is not limited to this mode of operation. A practical limit on the average grain boundary size may be the lateral dimensions of the underlying emitter. If the grain boundaries exceed the emitter dimensions, insufficient aluminum may be present above the emitter to program the fuse device. Amorphous polysilicon or large grain polysilicon may permit sufficient mass transport of aluminum atoms to the emitter surface to enable programming.

FIG. 2G is a cross section of die 6 after defining and etching polysilicon layer 40. N+ polysilicon emitter contact 42 and N+ polysilicon collector sink contact 43 respectively provide a contact to an emitter 44 (and 44') and to collector sink 25. Polysilicon emitter contact 42 has a lateral dimension which completely overlaps fuse base region 30 protecting fuse base 30 from an extrinsic base implant. A first polysilicon region 46 and a second polysilicon region 48 form desired resistive elements in a conventional manner. BJT 11 has a P+ base contact 51 coupled to a P+ region in the epitaxial layer 15. An extrinsic base implant provides this P+ region. Polysilicon contact 42 prevents alteration of fuse base 30 parameters during the extrinsic base implant operation. Formation of a thin cap oxidation follows the extrinsic base implant operation. Die 6 has a silicide exclusion mask applied thereafter, followed by a final implant and anneal/oxidation step. This step drives some of the dopants from the polysilicon contact areas into the underlying epitaxial layer 15. Creation of an emitter 44 in fuse device 10 and an emitter 44' in BJT 11 results from the dopants entering the epitaxial layer 15. After annealing, an oxide etch removes the thin oxide in selected areas. A deposition of a refractory metal follows the oxide removal. Preferably, the refractory metal is titanium ("Ti"). Heating reacts any titanium contacting bare polysilicon layer 40, thereby forming TiSi$_2$. After stripping excess titanium, a second silicide reaction produces TiSi$_2$ overlying all the polysilicon contact areas, except polysilicon contact 42. The LTO 49 prevents formation of TiSi$_2$ over polysilicon contact 42.

FIG. 2H is a cross section of die 6 after oxidation by a chemical vapor deposition ("CVD") process, followed by planarization etchback/CVD cap and contact mask/etch processes. The contact etch forms the via openings and etches through the TiSi$_2$ to the polysilicon layer 40. The oxidation removal may be any of the conventional processes. The oxidation removal also etches through the LTO 49 overlying polysilicon emitter contact 42. The preferred embodiment uses a Schottky compatible plasma etch process. After these processes, the via openings expose bare polysilicon layer 40 over all the contact areas. The TiSi Exclusion embodiment removes all the oxide over the polysilicon emitter 42. To ensure the removal of all the LTO 49, removal of some polysilicon of fuse emitter contact 42 is necessary. It is important not to remove excessive amounts of polysilicon, however. An increase in pre-programming incidence occurs upon complete removal of emitter contact 42 from over emitter 44. Therefore, etching should remove as little of the emitter contact 42 as possible, but in any event, all of the overlying oxide.

Figure 2I:
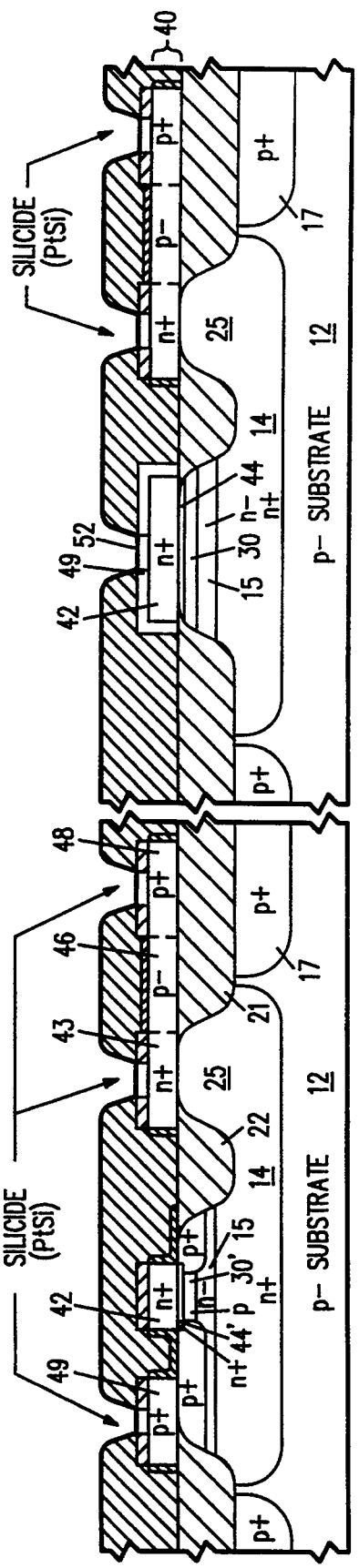

FIG. 2I is a cross section of die 6 before contact metallization. A Schottky compatible process exposes a second refractory metal, platinum ("Pt") to the die 6. Platinum contacts bare silicon, the polysilicon layer 40, in all the contact openings. A reacting step produces PtSi in all the exposed contact areas.

Figure 2J:
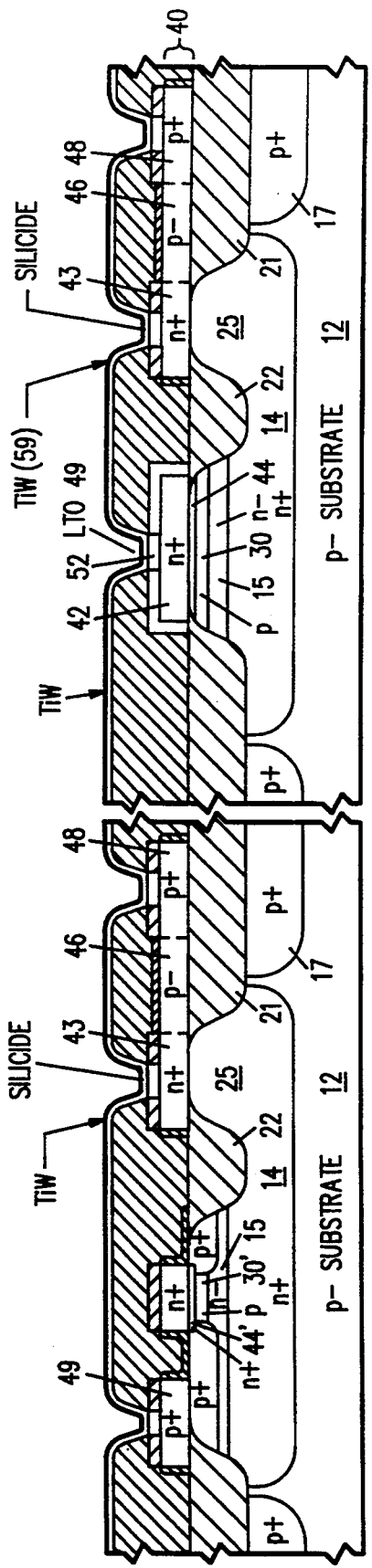

FIG. 2J is a cross section of die 6 with a barrier metal 54 deposited over its entire surface. Barrier metal 54 is typically titanium tungsten ("TiW") overlying all the contact areas. When the titanium tungsten overlies the polysilicon fuse emitter contact 42, the PtSi layer 52 separates the barrier metal from the fuse emitter contact 42.

Figure 2M:
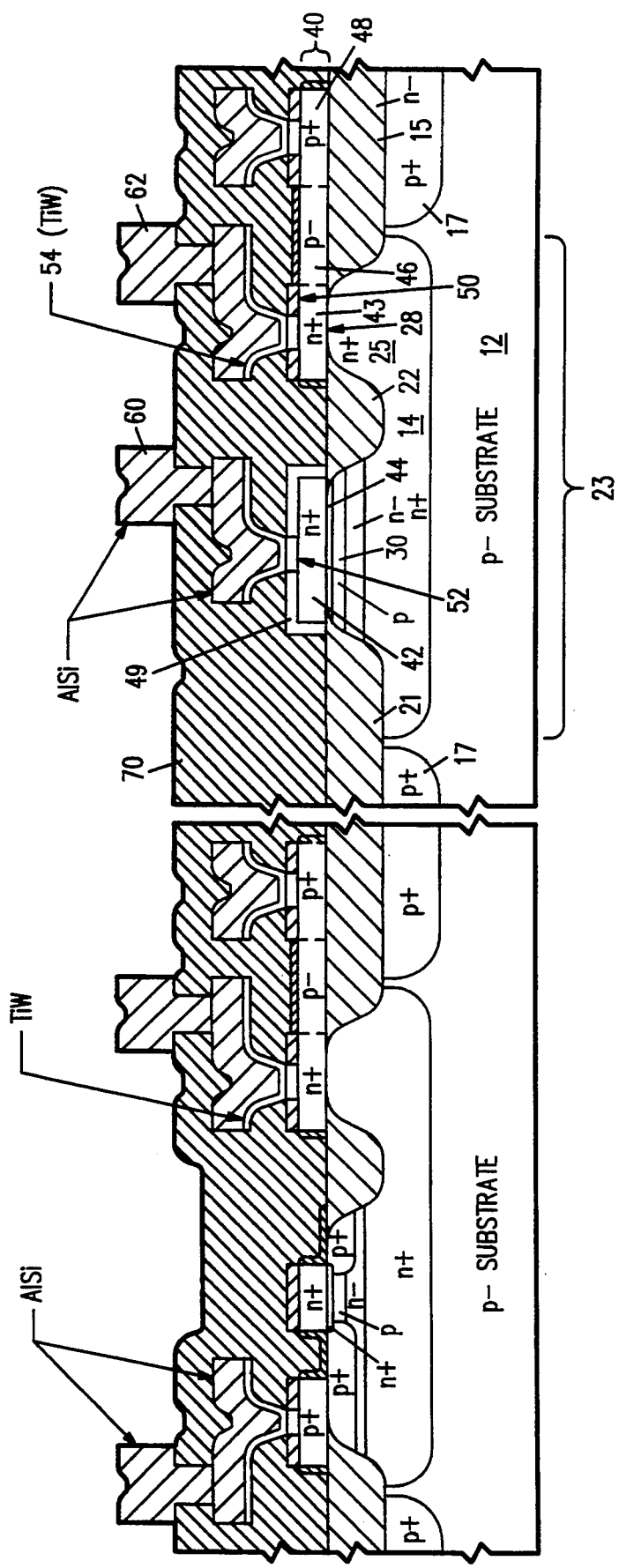
Figure 2K:
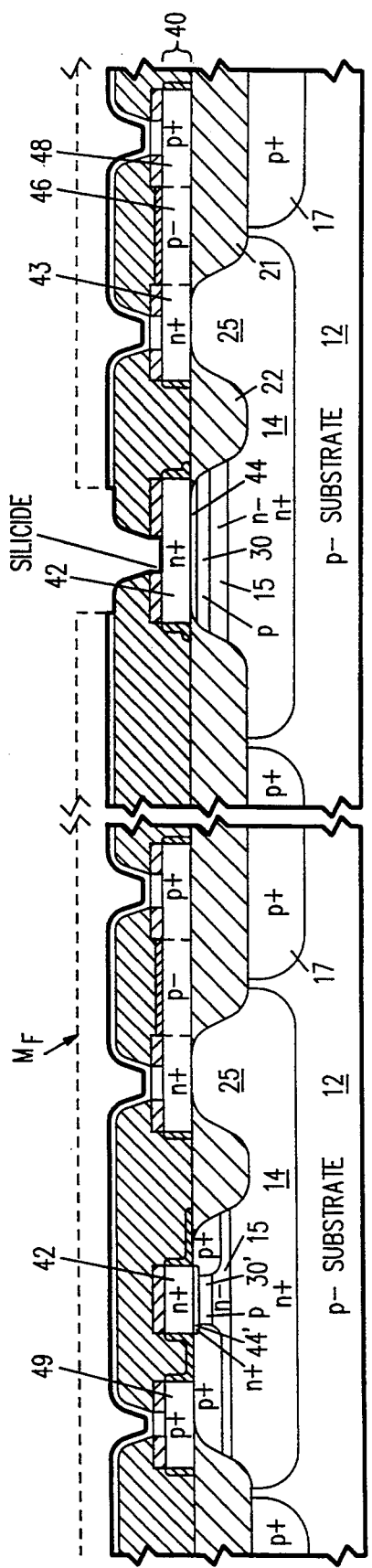

FIG. 2K is a cross section of die 6 after removal of the barrier metal from above fuse emitter contact 42. A wet $NH_4OH:H_2O_2$ TiW process removes excess barrier metal and does not affect the LTO 49.

Figure 2L:
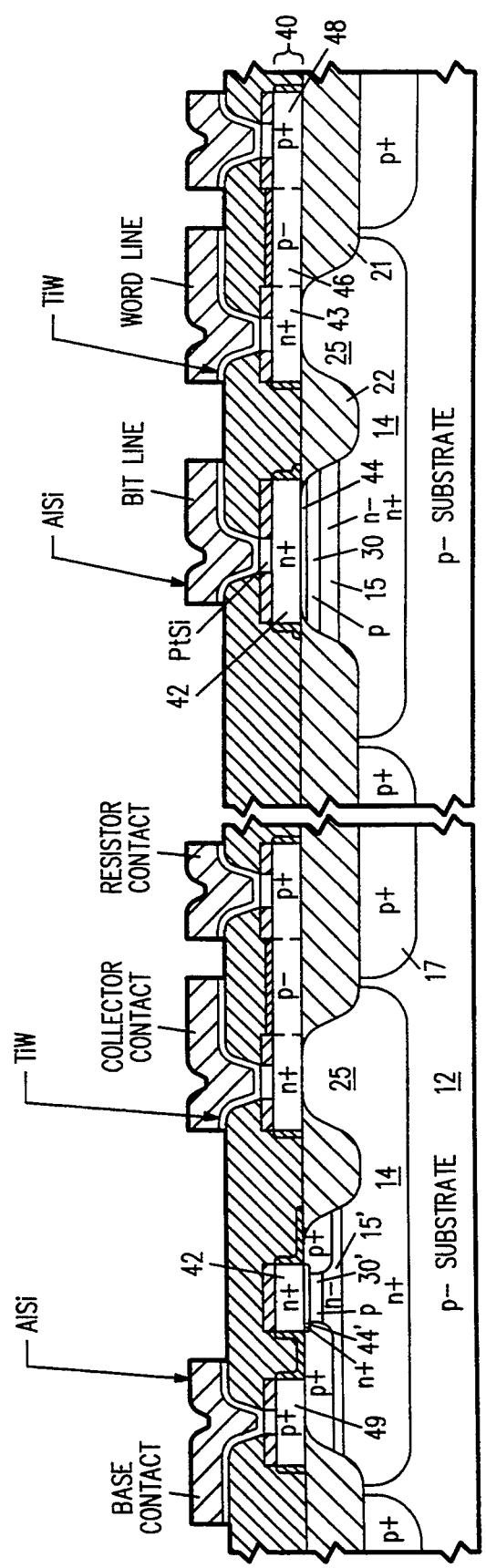
Figure 2M:
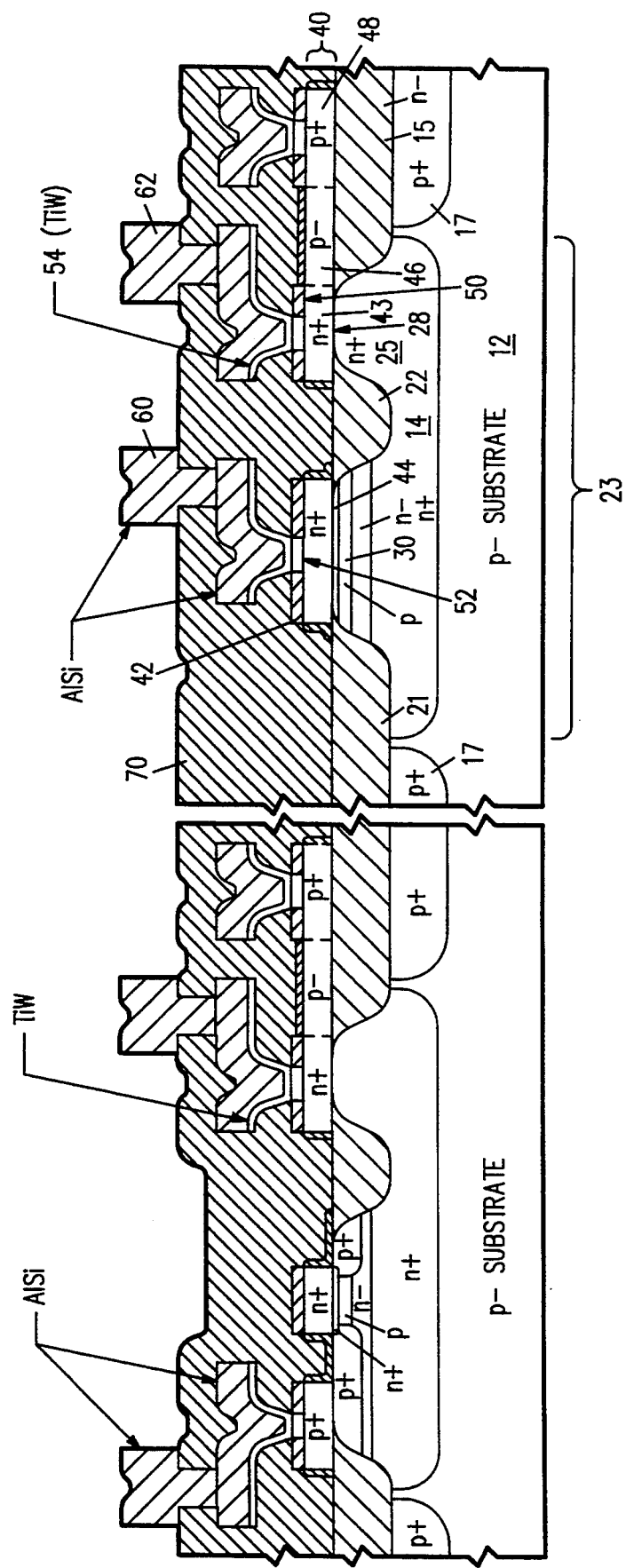

FIG. 2L is a cross section of die 6 with exposed polysilicon emitter contacts 42. Deposit of a first contact metal and its subsequent masking and etching, forms metal contacts to fuse device 10 and BJT 11. The deposited contact metal is a mixture of aluminum, silicon, and copper. Contact metallization deposits the contact metal directly on the polysilicon emitter contact 42 over polysilicon emitter contact 44. A layer of barrier metal between the contact metal and the polysilicon emitter contact 42 is not present. For connections to other active areas, barrier metal 54 (TiW) separates the contact metal from polysilicon layer 40.

FIG. 2M is a cross section of die 6 with a finally formed fuse device 10 and BJT 11 on the same die 6. A dielectric CVD oxide, M2-M1 VIA Contact VIA mask-/etch precedes the second metal deposition.

FIG. 2A through FIG. 2M are illustrative of processing to produce a preferred vertical fuse device as shown in FIG. 1, the $TiSi_2$ Exclusion embodiment.

B. $TiSi_2$ Replacement

Production of a preferred vertical fuse illustrated in FIG. 1' requires processing as depicted in FIGS. 2A—FIG. 2F and FIGS. 2G'-FIG. 2M'. A description of FIGS. 2A–2F set out above is applicable to formation of fuse device of FIG. 1'.

FIG. 2G' is a cross section of die 6 after defining and etching polysilicon layer 40. N+ polysilicon emitter contact 42 and N+ polysilicon collector sink contact 43 respectively provide a contact to an emitter 44 (and 44') and to collector sink 25. Polysilicon emitter contact 42 has a lateral dimension which completely overlaps fuse base region 30 protecting base 30 from an extrinsic base implant. A first polysilicon region 46 and a second polysilicon region 48 form desired resistive elements in a conventional manner. BJT 11 has a P+ base contact 51 coupled to a P+ region in the epitaxial layer 15. The extrinsic base implant provides this P+ region. Polysilicon contact 42 prevents alteration of fuse base 30 parameters during the extrinsic base implant operation. Formation of a thin cap oxidation follows the extrinsic base implant operation. Die 6 then has a silicide exclusion mask applied, followed by a final implant and anneal/oxidation step. This step drives some of the dopants from the polysilicon contact areas into the underlying epitaxial layer 15. Dopants entering the epitaxial layer 15 create an emitter 44 in fuse device 10 and an emitter 44' in BJT 11. After annealing, an oxide etch removes the thin oxide from selected areas. A deposition of a refractory metal follows the oxide removal. Preferably, the refractory metal is titanium ("Ti"). Reaction of the titanium wherever it contacts bare polysilicon layer 40, forming $TiSi_2$. After stripping excess titanium, a second silicide reaction produces $TiSi_2$ overlying all the unmasked polysilicon contact areas. These areas include the fuse emitter contacts 42. $TiSi_2$ formation over fuse emitter contact 42 results because LTO 49 does not completely cover it. Description of the replacement of the $TiSi_2$ by PtSi follows.

FIG. 2H' is a cross section of die 6 after oxidation by a chemical vapor deposition ("CVD") process, followed by planarization etchback/CVD cap and contact mask/etch processes. The contact etch forms the via openings and Contact overetch etches a portion of the $TiSi_2$ down to the etches through the $TiSi_2$ to the polysilicon layer 40. The particular process may be any of the conventional processes. polysilicon layer 40 overlying emitter contact 42. The preferred embodiment uses a Schottky compatible plasma etch process.

FIG. 2I' is a cross section of die 6 before contact metallization. A Schottky compatible process exposes a second refractory metal, platinum ("Pt") to the die 6. Platinum contacts bare silicon, the polysilicon layer 40, in all the contact openings including those areas over the polysilicon fuse emitter 42. There is no oxide separating the platinum from the polysilicon. A reacting step produces PtSi in all the exposed contact areas. Heating the platinum to about 450° C. forms PtSi layer 52. Schottky devices require the PtSi, and its use in the vertical fuse is optional. Acceptable fusing action results if PtSi is present. Conversion of the Pt to PtSi occurs in the exposed polysilicon regions, and remains as unreacted Pt over any oxide. HCL aqua regia strips unreacted Pt from over the oxide, leaving the device as shown in FIG. 2I'.

FIG. 2J' is a cross section of die 6 with a barrier metal 54 deposited over its entire surface. Barrier metal 54 typically comprises titanium tungsten ("TiW"), overlying all the contact areas. When the titanium tungsten overlies the polysilicon fuse emitter contact 42, there is not an oxide layer separating the barrier metal from the fuse emitter contact 42 as illustrated in FIG. 2J.

FIG. 2K' is a cross section of die 6 after removal of the barrier metal from above fuse emitter contact 42. A wet $NH_4OH:H_2O_2$ TiW process removes this excess barrier metal.

FIG. 2L' is a cross section of die 6 with exposed polysilicon emitter contacts 42. Deposit of a first contact metal and its subsequent masking and etching, forms metal contacts to fuse device 10 and BJT 11. The deposited contact metal is a mixture of aluminum, silicon, and copper. Contact metallization deposits the contact metal directly on the polysilicon emitter contact 42 over polysilicon emitter contact 42. A layer of barrier metal between the contact metal and the polysilicon layer 40 is not present. For connections to other active areas, barrier metal 54 (TiW) isolates the contact metal from polysilicon layer 40.

FIG. 2M' is a cross section of die 6 having a finally formed fuse device 10 and BJT 11 on the same die 6. A dielectric CVD oxide, M2-M1 VIA Contact VIA mask-/etch precedes the second metal deposition.

III. Polysilicon Fuse Performance

Figure 3:
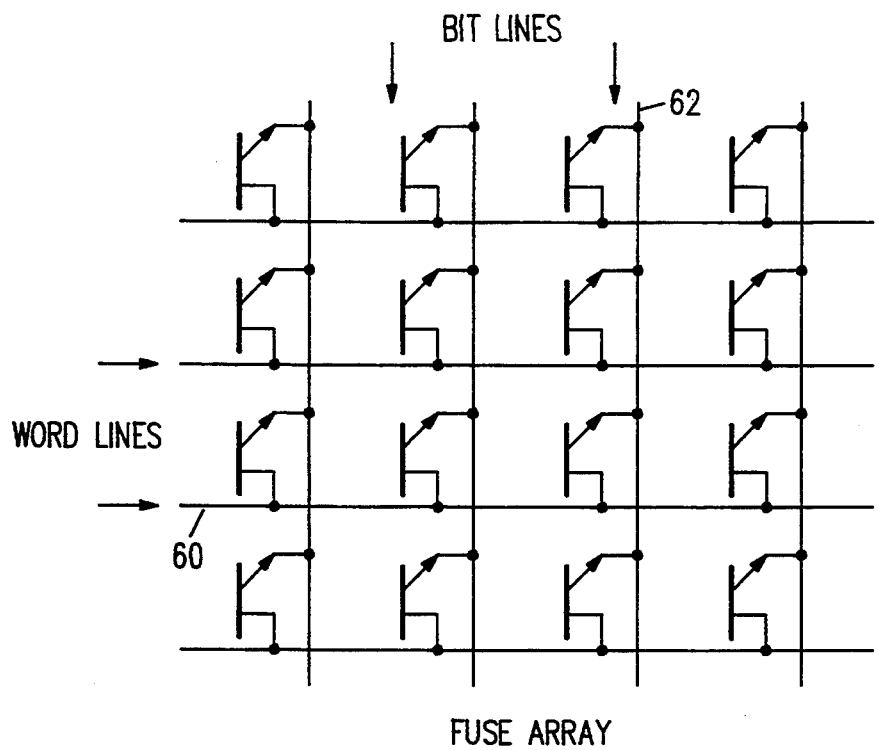
FIG. 3 is a schematic of an array of unprogrammed fuses.

FIG. 3 is a schematic of an array of unprogrammed fuses 10 of the type illustrated in FIG. 1 or FIG. 1'. Each fuse structure of FIG. 1 (or FIG. 1') occupies one position in the array of FIG. 3. Connections to both a bit line 60 and a word line 62 provide an operable fuse array element. The floating base NPN transistor has no connection to the base region.

Figure 4:
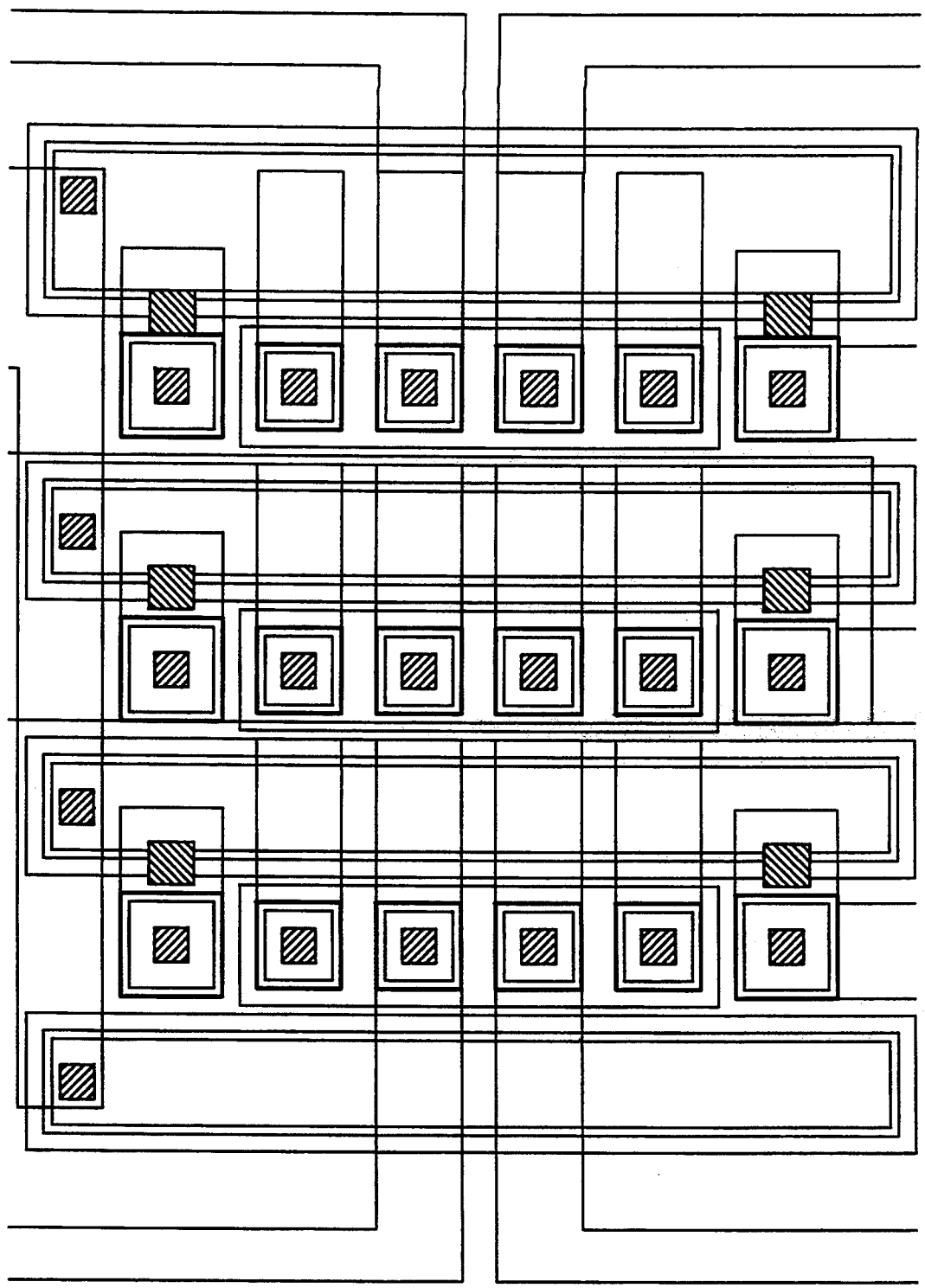
FIG. 4 is an overhead view of the array of individual fuses 10 illustrated in FIG. 3.

FIG. 4 is an overhead view of the array of individual fuses 10 illustrated in FIG. 3. As shown, the manufacture of fuses 10 provides them with a final rectilinear configuration. Each fuse measures about 2.0 microns to a side, with each fuse having four corners. The illustrated configuration is the actual isolation mask. During processing, these corners become slightly rounded and are not such sharp corners.

Operation of the fuse device is not fully understood. However, without wishing to be bound to any particular mode of operation, one possible explanation for operation of the fuse device is provided below. It is believed that the absence of the barrier metal allows some aluminum atoms from the contact metal to diffuse or migrate through and among a plurality of polysilicon columnar grain boundaries. These aluminum atoms collect at an interface between the polysilicon and the epitaxial layers. The epitaxial layer is typically monocrystalline. The polysilicon grains have an approximate diameter of about 200 Å. Use of other contact metals, such as Al/Cu/Si alloys, is possible.

Diffusion of the aluminum metal atoms changes the nature of the polysilicon emitter contact from part contact and part emitter to a low resistance contact. The low resistance contact couples the metal contact to the shallow emitter in the epitaxial layer. Additionally, the diffusion results in the collected aluminum atoms forming a supply of contact metal atoms at the interface between the polysilicon and the epitaxial layers. During programming, some of these aluminum atoms will form an ohmic contact from the low resistance contact, through the emitter, to the base as described below.

Production of an electric field results from reverse bias of the emitter-collector of the fuse device during programming. The electric field is responsible for an increase in thermal energy, which increases a solid solubility of silicon of the emitter region. The silicon of the emitter region forms a mixture of Al and Si which is molten at 550° C. Silicon combines with the supply of aluminum atoms at the interface. The thermal energy causes the mixture to melt, forming a void in the single crystal silicon through dissolution of the silicon into the aluminum. The aluminum atoms collected at the polysilicon-monocrystalline interface fill the void and provide the ohmic contact from the low resistance contact to the base. The base is less susceptible to overblowing because it is relatively thick.

Programming fuse device 10 generates heat at an emitter 44-base 30 junction due to transient reverse biasing of the junction. Application of a programming current produces electric fields in the device, generating heat. This heat causes a temperature of fuse device 10 to rise, especially in the corners of fuse device 10 where the electric fields are the most intense. Emitter 44, by being shallow, permits the heat to affect the interface region where aluminum atoms have gathered and are in solution with polysilicon contact emitter 42.

At or about 550° C., the eutectic point of the combination, emitter 44 becomes molten. Making an ohmic contact through emitter region 44 from emitter contact 42 to base 30 results when the molten aluminum rich silicon flows into the void, shorting the emitter contact to the base. The ohmic contact also provides a decreased series resistance for the programmed device.

The programming operation of the fuse device 10 is self-limiting. A voltage potential across the emitter contact 42 and the collector 14 exists during programming. The shorting of the emitter 44 reduces the series resistance. The emitter shorting automatically reduces the voltage potential and consequently reduces the programming power. Thus, a reduction of the risk of applying excessive programming current results. Detecting the voltage drop is relatively straightforward. Stopping the programming current after detecting the voltage drop ends the electric fields responsible for the heat generation. Without further heat generation, the temperature drops, allowing the recrystallization of the silicon, permanently shorting the emitter. Making the emitter thin and the base relatively thick makes sure that the thermal momentum of the ohmic contact is not enough to allow it to melt through fuse base 30.

When the ohmic contact melts through the fuse base 30, an overblow condition results. The overblow forms an irrevocable Schottky diode contact to the N⁻ epitaxial layer 15 beneath the P type base and is undesirable.

The high breakdown voltages of the vertical fuse reduces crosstalk and coupling between fuses. Therefore a programming of a first fuse will not affect an ability to program adjacent fuses in an array.

Figure 5:
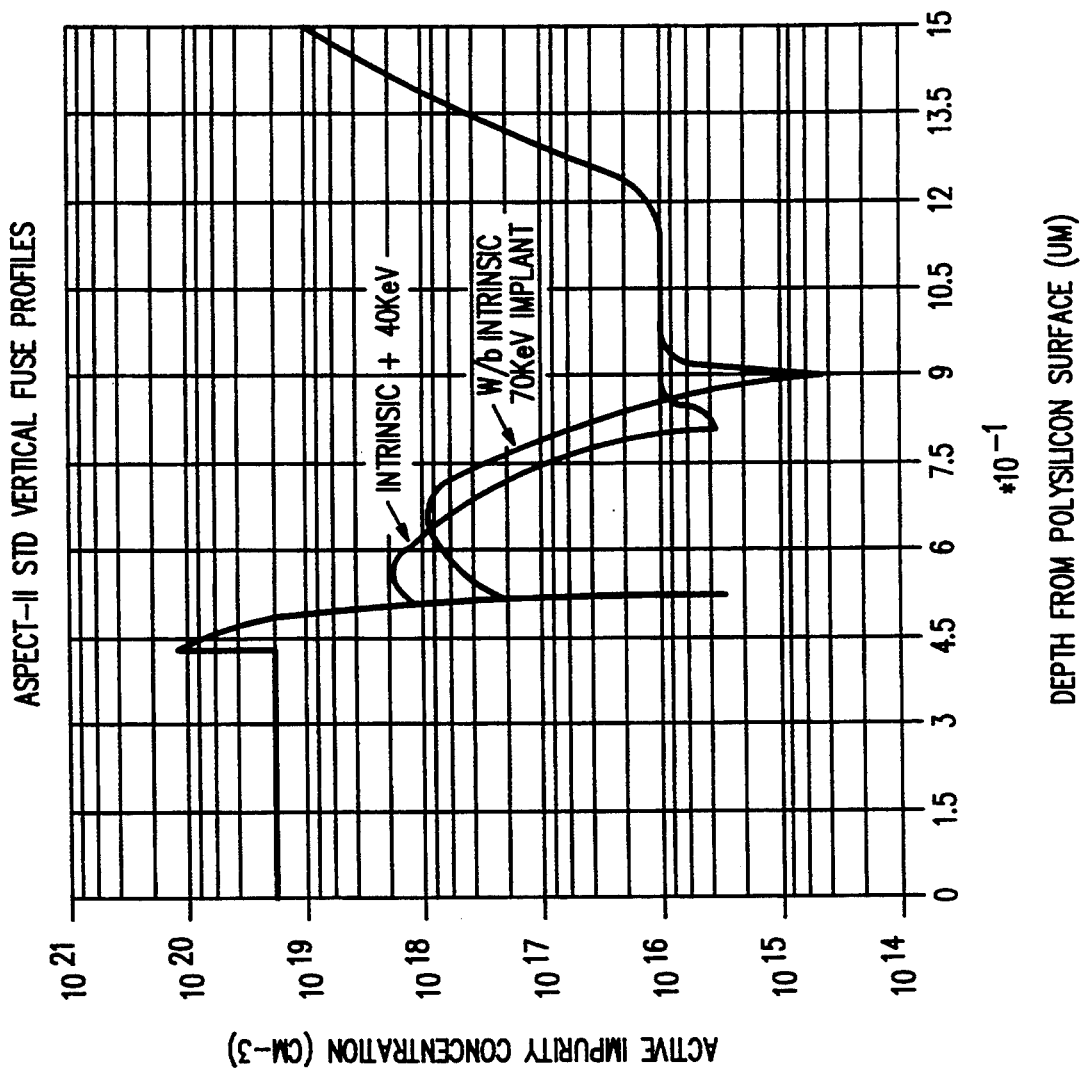
FIG. 5 is a diagram of a simulated and calibrated dopant concentration versus depth within the structure of FIG. 1 or FIG. 1'.

FIG. 5 is a graph illustrating a relationship of dopant concentration as a function of depth below the polysilicon mono-crystalline interface. The illustrated dopant concentration progresses through the polysilicon contact and single crystal emitter, base 30, collector 14, and substrate 12. As shown, at a surface of polysilicon contact 42, an arsenic dopant predominates with an average chemical concentration of about $2 \times 10^{19}$ atoms per cubic centimeter. At a polysilicon emitter contact 42/emitter 44 interface, a concentration of emitter 44 rises to about $1.2 \times 10^{20}$ atoms per cubic centimeter. At an emitter 44-base 30 junction, emitter 44 concentration falls to less than about $4 \times 10^{16}$ atoms per cubic centimeter. The P type base dopant dominates the N type emitter dopant from about 0.52 microns into the structure to about 0.9 microns. A maximum doping for base 30 is about $1 \times 10^{18}$ atoms/cm³ at a depth of about 0.68 microns. At or about 0.8–0.9 microns into the structure, the dopant concentration of the N+ collector 14 begins to dominate. This reflects the upward diffusion of the collector dopant into the epitaxial layer by about 0.5 microns during the oxidation process used to form field oxide regions 21 and 22.

FIG. 6 is a cross section of emitter contact 42, emitter 44, base 30, and buried layer 14 illustrating the fusing action of the structure of FIG. 1. Disposition of the contact metal in diffusible communication with polysilicon layer 40, as described above, permits aluminum atoms to collect at an emitter 44, emitter contact 42 interface. Aluminum atoms do not diffuse or migrate into the polysilicon layer for typical BJT devices.

FIG. 6' is a cross section of emitter contact 42, emitter 44, base 30 and buried layer 14 illustrating the fusing action of the structure of FIG. 1'. Aluminum atoms have collected at an emitter 44-emitter contact 42 interface. Aluminum atoms do not diffuse or migrate into the polysilicon layer for typical BJT devices.

Before programming the fuse, the structure of FIG. 1 or FIG. 1' has an emitter-collector breakdown voltage of about 3.0 volts and a collector-emitter breakdown voltage of about 8.0 volts. Programming the structure results from applying a current or voltage pulse to emitter 44 in an emitter-collector breakdown mode. Preferably, programming uses an application of a 40 milliamps current for about 7 microseconds having a resulting energy of about 1.6 microjoules and a power of about 250 milliwatts. A preferred embodiment provides this programming current as a train of current pulses of 7 μsec duration, with 93 μsec delay between pulses. Incrementing successive pulses by 10 mA per pulse until detecting the voltage drop will properly program the device. These pulses heat the interface between emitter 44 and polysilicon contact 42 to its eutectic melting point of about 550° C., allowing the rapid dissolution of the silicon into the metal. The result is an ohmic contact 80 (as shown in FIG. 6 and in FIG. 6') which extends through the emitter 44-base 30 junction to short metal contact 60 to base 30. After programming, the collector-base breakdown voltage will be about 20 volts. At 100 microamps the forward voltage will be 0.85 volts, and the series resistance will be about 150 ohms.

Figure 7:
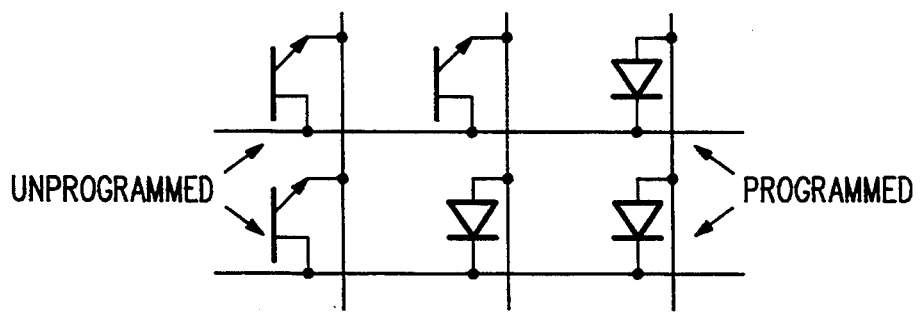
FIG. 7 illustrates an array of fuses with selected fuses programmed.

FIG. 7 illustrates an array of fuses with selected fuses programmed. Floating base transistors represent the unprogrammed fuses and collector-base diodes represent the programmed fuses. Appropriate well known circuitry coupled to the word and bit lines of the array in FIG. 7 will detect the programmed ("1") and unprogrammed ("0") fuses. This circuitry can then interpret and supply to other circuitry suitable signals indicative of the "1" or "0" detected.

The described vertical fuse is particularly good because it employs a low dose high energy P type implant under a shallow emitter while masking the standard BJT intrinsic base from the device. This provides lower programming currents, higher collector-emitter and emitter-collector breakdown voltages, and lower emitter-base capacitance.

IV. Codiffused Embodiments

An alternate preferred embodiment is a codiffused vertical fuse 10'. Codiffused vertical fuse 10' has a similar structure as fuse device 10, except for changes as outlined below. These changes affect base, emitter and emitter contact characteristics with attendant performance changes. Codiffusion addresses formation of the fuse base to provide a fuse with enhanced fusing characteristics. Codiffusion provides both P and N type dopants in the polysilicon layer which overlies both the emitter and the base. One of the dopants diffuses ahead of the other to modify the base parameters while the slower diffusing dopants create the emitter. The TiSi₂ Exclusion or the TiSi₂ Replacement procedures are both useful with the codiffusion process to provide the contact metal in diffusible communication with the emitter.

A. TiSi₂ Exclusion

Figure 8:
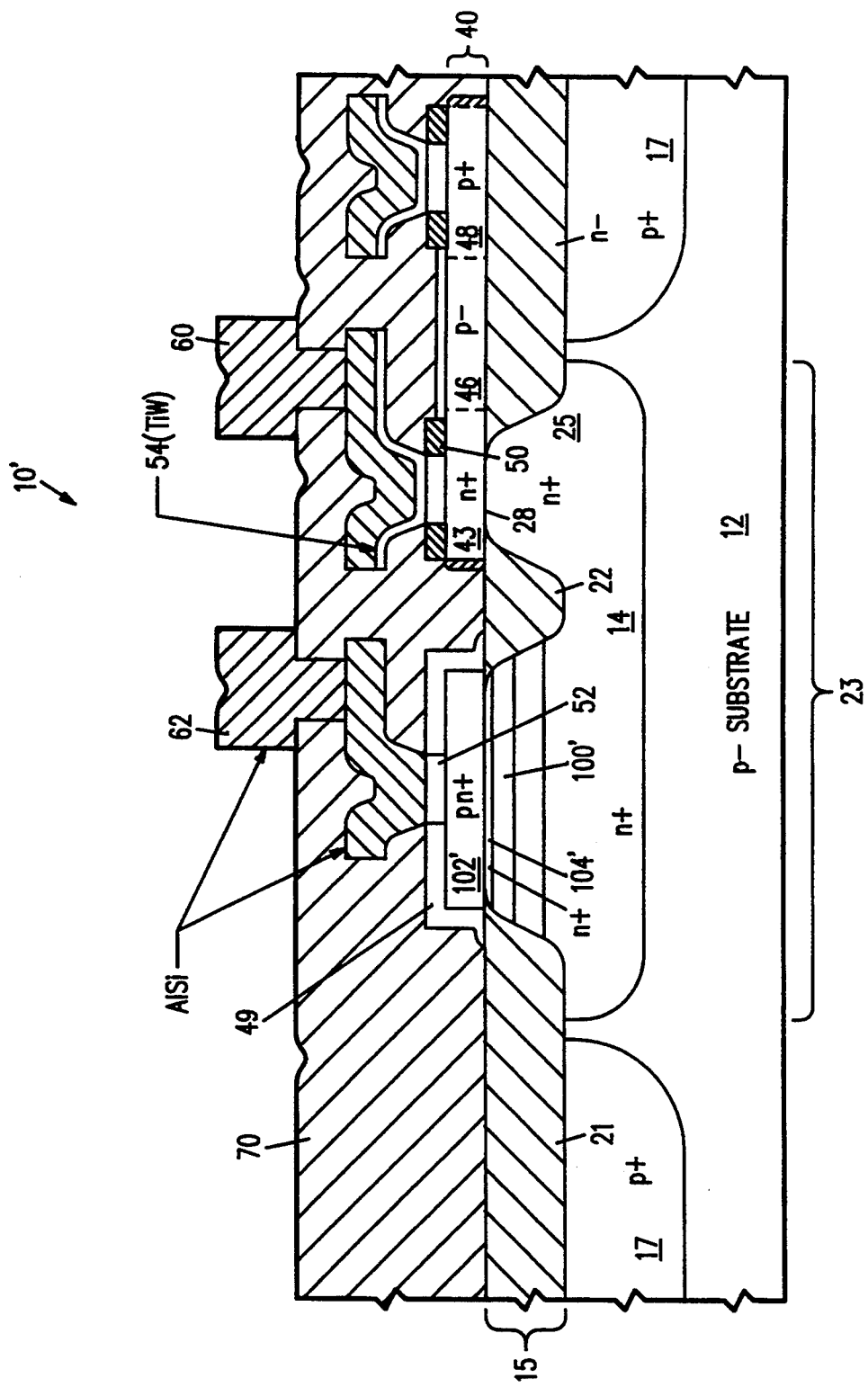
FIG. 8 is a cross section of a preferred embodiment of a codiffused vertical fuse BJT device of a single polysilicon construction.
Figure 8:
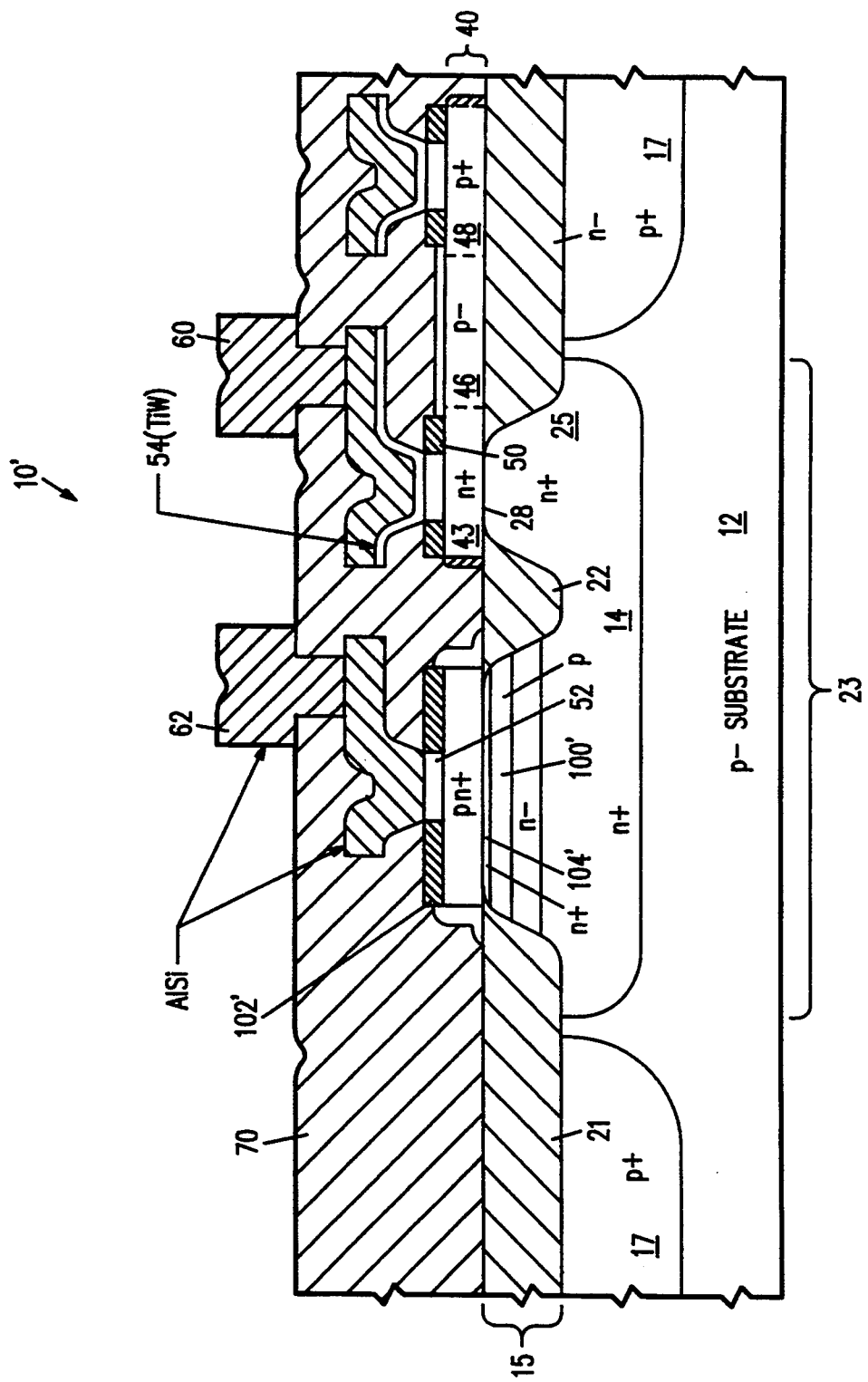

FIG. 8 is a cross section of a preferred embodiment for a semiconductor codiffused fuse device 10' with the initial silicide excluded from over an emitter contact. This embodiment is similar to a fuse device 10 of FIG. 1. FIG. 8' is a cross section of a second preferred embodiment for a codiffused fuse device 10' having a contact structure similar to that of FIG. 1'. Codiffused vertical fuse 10' has a fuse base 100' with an active chemical dopant concentration of a P type dopant. The active chemical dopant concentration is about $1 \times 10^{18}$ to about $5 \times 10^{18}$ atoms/cm³, at a depth of about 0.1 microns below an interface between polycrystalline silicon and monocrystalline silicone. Fuse base 100' has a thickness of between about 0.2 and 0.4 microns, with about 0.4 microns preferred.

Polysilicon layer 40 has a thickness of about 4500 Å over epitaxial layer 15. Select regions have desired active chemical dopant concentrations. A polysilicon contact 102' with N and P type dopant atoms, typically arsenic and boron, have an active chemical dopant concentration of about $1 \times 10^{19}$ to about $1 \times 10^{20}$ atoms/cm³, with $5 \times 10^{19}$ atoms/cm³ preferred for the arsenic atoms. For the boron atoms, the active chemical dopant concentration is about $1 \times 10^{18}$ to about $1 \times 10^{19}$ atoms/cm³. A preferred embodiment has an active chemical dopant concentration of about $5 \times 10^{19}$ atoms/cm³.

A codiffused vertical fuse emitter 104' formed below polysilicon contact 102' and overlying fuse base 100' has some of the N and P type dopant atoms diffused into it. Emitter 104' extends from about 0.05 to about 0.1 microns, with 700–800 Å preferred. Emitter 104' has an active chemical dopant concentration at the surface of about $1 \times 10^{18}$ to about $1 \times 10^{19}$ atoms/cm³, with $5 \times 10^{19}$ atoms of arsenic/cm³ preferred.

The above described structure indicates that fuse base 100' does not have an external connection and is floating in the preferred embodiment. Fuse base 100' incorporates some of the boron P type atoms from polysilicon contact 102' which have diffused faster than the arsenic atoms forming emitter 104'. The codiffused P type atoms modify a gain and a thickness of fuse base 30' to provide a codiffused vertical fuse 10'. The codiffused vertical fuse is useful for reliable and effective fuses and has fewer masking steps. The gain ($\beta$) of vertical fuse device 10' is about 2 to about 4. Vertical fuse device 10' has a $BV_{eco}$ of about 15 V to about 20 V and a $BV_{eco}$ of about 2.5 V to about 3.0 V. These values are not optimal because significant change of the extrinsic $\beta$ of a high gain transistor by use of the available codiffused P type dopants is difficult. The P+ dose implant for the standard processing of the resistors and the BJT 11 base 30' sets up and fixes the chemical concentration of the P type dopants for the codiffused processing. The codiffused embodiment uses the same P type dopants. As described below, codiffused vertical fuse 10' is simpler from a manufacturing view because it requires one less masking operation. Therefore this codiffused embodiment is an alternate preferred embodiment.

B. TiSi₂ Replacement

Figure 9C:
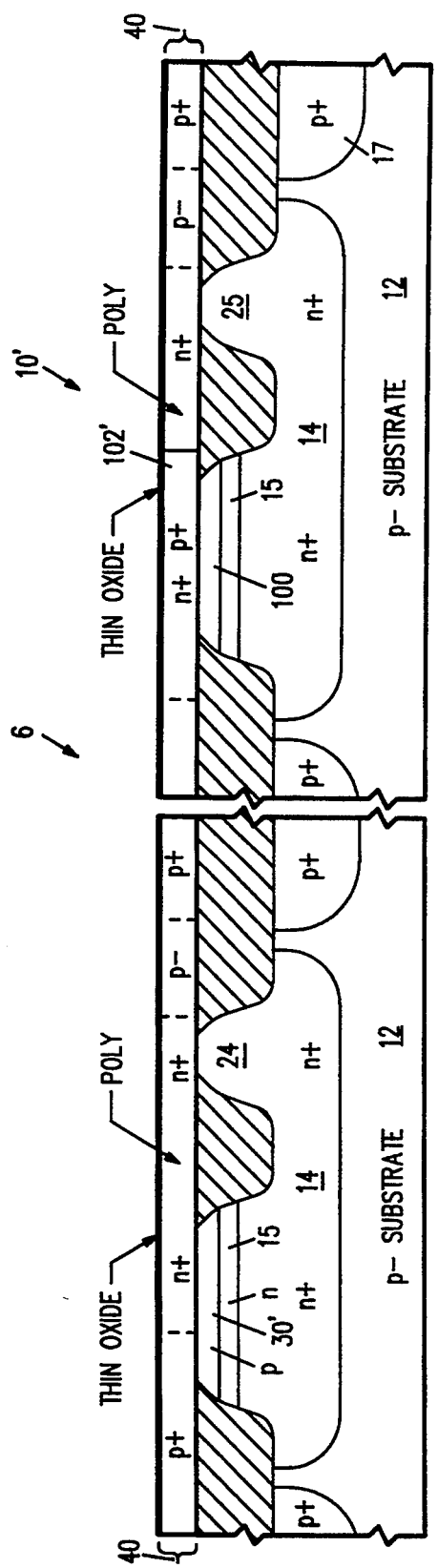

The sequence of processing steps to produce codiffused vertical fuse 10' would include those steps illustrated in FIGS. 2A–2C, and 2G–2M for codiffused vertical fuse 10' of FIG. 8. For the codiffused vertical fuse 10' of FIG. 8' performing the processing steps of FIGS. 2A–2C and 2G'–2M' results in an acceptable vertical fuse. FIGS. 9A, 9B, and 9C represent respectively, changed FIGS. 2D, 2E, and 2F. These changed processing steps include desired steps to produce codiffused vertical fuse 10' of either FIG. 8 or FIG. 8'.

FIG. 9A is a cross section of die 6 having a sink mask (not shown) and a sink implant step performed. After an anneal step, processing includes an intrinsic unmasked base implant of BJT 11 and fuse device 10'. The base implant provides BJT 11 with a base 30' and vertical fuse device 10 with a base 100. Both bases have an active chemical dopant concentration of about $1 \times 10^{17}$ to about $1 \times 10^{18}$ atoms/cm$^3$, with about $1 \times 10^{18}$ atoms/cm$^3$ preferred. Typically, a 49 BF$_2$+ implant in single crystal silicon forms the base implant before polycrystalline deposition. The codiffused vertical fuse, then, does not receive a boron fuse implant, but does receive P− and P+ polysilicon implant dopants. This P− implant provides a $\beta$ for the to-be-formed fuse device in the range of about 80 to about 150 comparable as for a standard BJT. The addition of P+ and its diffusion into the base 100 drops the $\beta$ to less than 10 for the fuse device.

FIG. 9B is a cross section illustrating a changed process by dropping the step illustrated in FIG. 2E. That is, FIG. 9B is a null operation illustrating there is NOT a fuse mask M$_F$ overlying fuse device 10'. The changed process does not use separate base implants to provide different base parameters. Simply stated, the change to the processing of FIG. 2E for the codiffused embodiment drops the fuse mask and implant steps. Instead, the changed process uses the P+ polysilicon mask and implant to provide P+ dopants to decrease the $\beta$ to an acceptable level. Opening the fuse emitter contact 42 up for the P+ polysilicon mask M$_p$ which provides P+ dopants to the resistor and forms the base contacts now also provides P+ dopants over the base 100 in the polysilicon layer 40.

FIG. 9C is a cross section of die 6 having a layer 40 of polysilicon deposited over an entire surface of die 6. The polysilicon has a thickness in the range of about 4000 Å–5000 Å, preferably 4500 Å. Polysilicon layer 40 has a thin cap oxidation. Implanting both P and N type dopants into polysilicon layer 40 through the cap oxidation provides a source of both dopant types in the polysilicon layer. Oversize masks form P+, P−, and N+ areas in polysilicon layer 40 where further processing will form various elements such as emitter, base, and collector contacts, and resistive elements for fuse device 10' and BJT 11.

Processing forms a polysilicon contact 102' over base 100 of the fuse device 10'. Polysilicon contact 102' has both N+ and P+ dopants overlying base 100'. The chemical concentrations of the N type dopants are about $1 \times 10^{19}$ to about $1 \times 10^{20}$ atoms/cm$^3$, and the P type dopants are about $1 \times 10^{18}$ to about $1 \times 10^{19}$ atoms/cm$^3$. The N+ dopant's concentration is preferably $5 \times 10^{19}$ and the P+ dopant's concentration is preferably $5 \times 10^{18}$ atoms/cm$^3$.

During the anneal step described for FIG. 2G, both the N and the P type dopants will diffuse into the underlying semiconductor structure. The P type dopants diffuse faster than the N type dopants and decrease the $\beta$ of fuse device 10' to an acceptable range. The slower N type dopants form emitter 104' with characteristics as described above.

Figure 10:
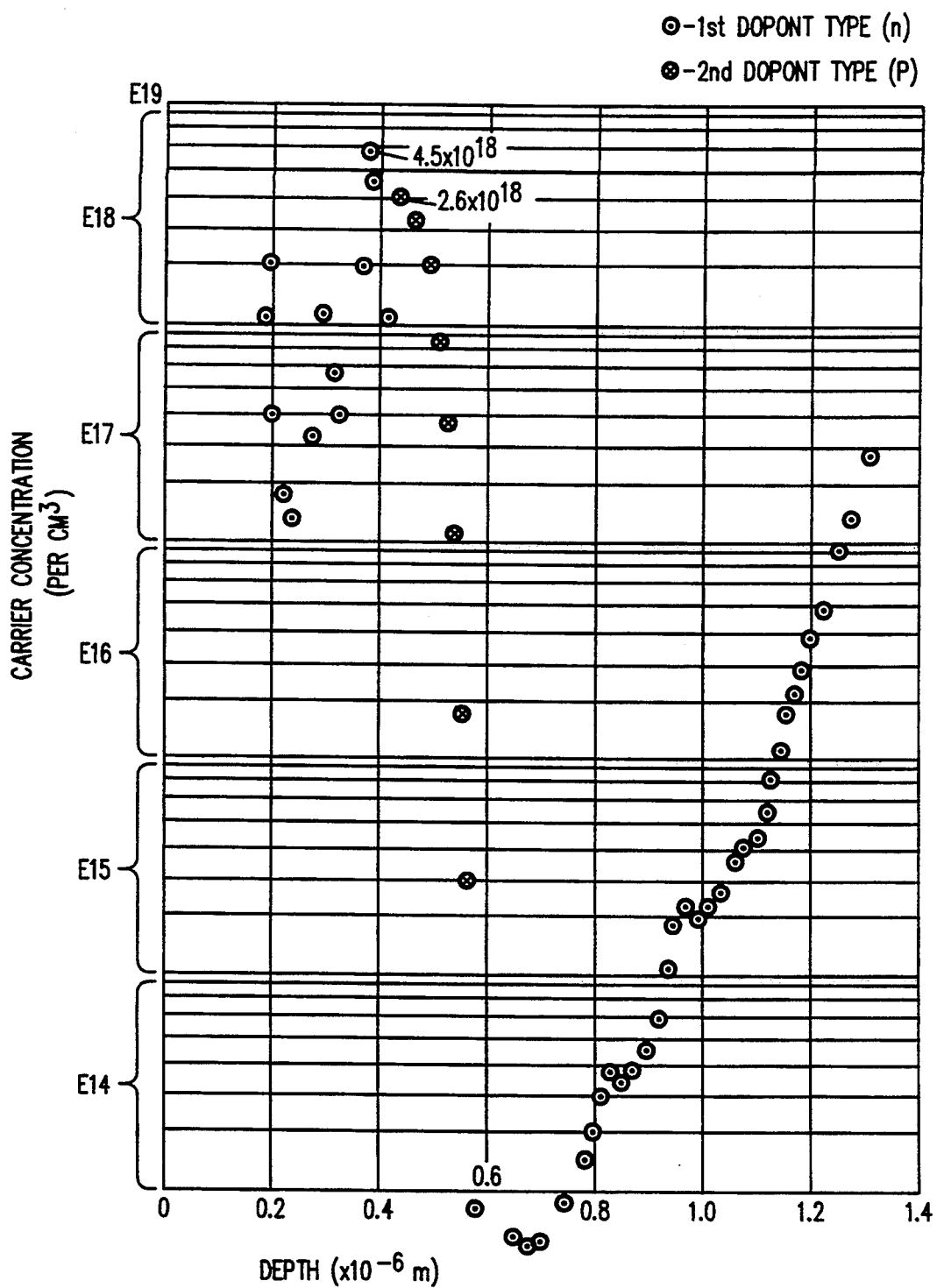
FIG. 10 is a cross section of the dopant concentration of codiffused vertical fuse 10 versus depth within the structure as measured by a spreading resistance technique.

FIG. 10 is a cross section of the dopant concentration of codiffused vertical fuse 10' versus depth within the structure.

According to this embodiment of the invention, an additional base mask and separate implant step described above are not present. Polysilicon contact 102' over base area 100' and emitter 104' includes both N+ and P+ dopants. The P+ dopants diffuse ahead of the N+ dopants and reach the interface between the polysilicon and the epitaxial layer first. These dopants continue into the epitaxial layer and change characteristics of base 100'. The N+ dopants which follow, form the shallow emitter. This procedure produces an acceptable fuse device with one less masking operation although the basewidth and the BV$_{eco}$ and BV$_{eco}$ is lower than optimal.

V. Non-Polysilicon Implementation

Figure 11:
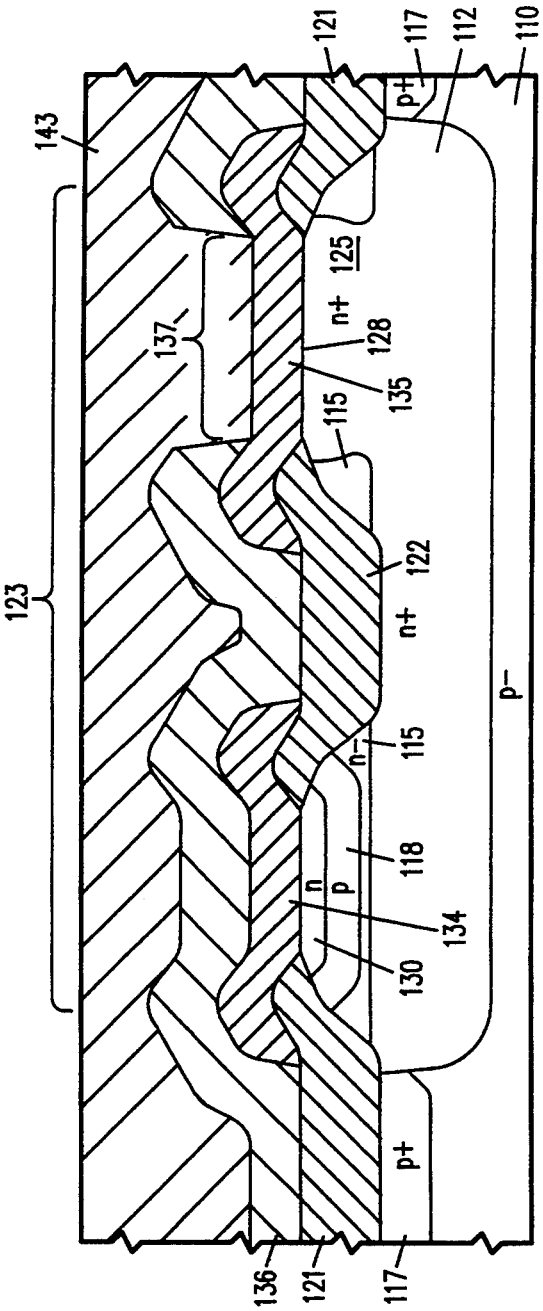
FIG. 11 is a cross section of a preferred embodiment of a vertical fuse in a non-polysilicon implementation.

FIG. 11 is a cross section of a semiconductor structure which includes a P conductivity type silicon substrate 110 doped with boron to a resistivity of 1 to 3.5 $\Omega$·cm. A buried layer 112 extends into substrate 110. The preferred embodiment dopes the buried layer 112 with antimony to a peak concentration of about $3 \times 10^{19}$ atoms per cubic centimeter. Deposition of a thin epitaxial layer 115 over the upper surface of the substrate 110 and buried layer 112 occurs next. The thin epitaxial layer 115 also of monocrystalline silicon. In the preferred embodiment, epitaxial layer 115 is about 1.1 microns thick and doped with phosphorus to a concentration of $1 \times 10^{16}$ atoms per cubic centimeter. Introducing a channel stop implant 117 before the epitaxial layer deposition in future field oxide regions prevents channel inversion at the silicon dioxide/silicon interface. As described in the Peltzer patent, masking and etching silicon nitride formed over epitaxial silicon 115 creates desired features. Next, a high temperature oxidation creates fully recessed field oxide regions 121. In the preferred embodiment, region 121 is annular and surrounds an island 123 of epitaxial silicon 115, providing an electrically-isolated pocket for forming active and passive devices within. Another portion of field oxide 122 separates a collector sink 125 from other active devices of the transistor.

After formation of the first field oxide region 121 and the second field oxide region 122, heavily doping the collector sink 125 with an N type dopant, typically phosphorus, provides a connection between surface 128 and buried layer 112. Buried layer 112 is the collector of the bipolar transistor, therefore a connection to collector sink 125 at surface 128 is a collector contact for the transistor. Implanting a base 118 with P type dopants having a concentration of about $2 \times 10^{18}$ atoms per cubic centimeter at a depth of 0.22 microns provides a low gain, relatively thick base. As a final step in manufacture of the substrate structure, doping an emitter 130 forms the remaining transistor structure. The transistor thereby created has emitter 130, base 115 and collector 112. On the upper surface 128 of the structure, conventional techniques deposit a first layer of metal contacts 134 and 135. Well known photolithographic techniques define the metal contacts 134 and 135. Metal lines 134 provide the bit lines for the array and extend perpendicular to the plane of the drawing of FIG. 11.

Provision of via openings 137 follow a deposit of an intermediate dielectric 136 over the first layer metal. Any of the conventional techniques are useable to form the via openings 37 and the dielectric deposit. Deposit and definition of a second metal layer 143 provide word lines for the array. Contact 135 to the collector sink 125 provides a connection to the fuse for the word line 143. Word line 143 extends perpendicular to the bit line 134 in the same plane as the bit lines.

In a preferred embodiment of the present invention, first and second silicon dioxide field regions 121 and 122 completely surround the base region 118. This serves to retain heat during programming because of differences between thermal resistivities of SiO$_2$ and Si. The SiO$_2$ has a higher thermal resistivity than the Si. The reader will appreciate that as a fuse size increases and a ratio of silicon to field oxide increases, programming the larger fuse requires more power because dissipation of generated heat occurs more readily.

The emitter 130 includes arsenic atoms and has an electrically active dopant concentration of $3 \times 10^{19}$ atoms per cubic centimeter at its upper surface 128, and a total chemical dopant concentration of $8 \times 10^{19}$ atoms per cubic centimeter. The emitter 130 is about 0.21 microns deep, while 4% copper and 0.9% silicon, by weight, with about 95.1% aluminum make up the metal contacts 135. The lower dopant concentration of the emitter 130 is critical to the present invention and, as discussed, provides several advantages over prior art fuses.

FIG. 3 is a schematic diagram illustrating an interconnected array of individual fuses of FIG. 11. Each fuse structure of FIG. 11 occupies one position in the array of FIG. 3 and includes connections to both a bit line 134 and a word line 143. Each fuse consists of a floating base NPN transistor, therefore a connection is not necessary for the base region.

Figure 12:
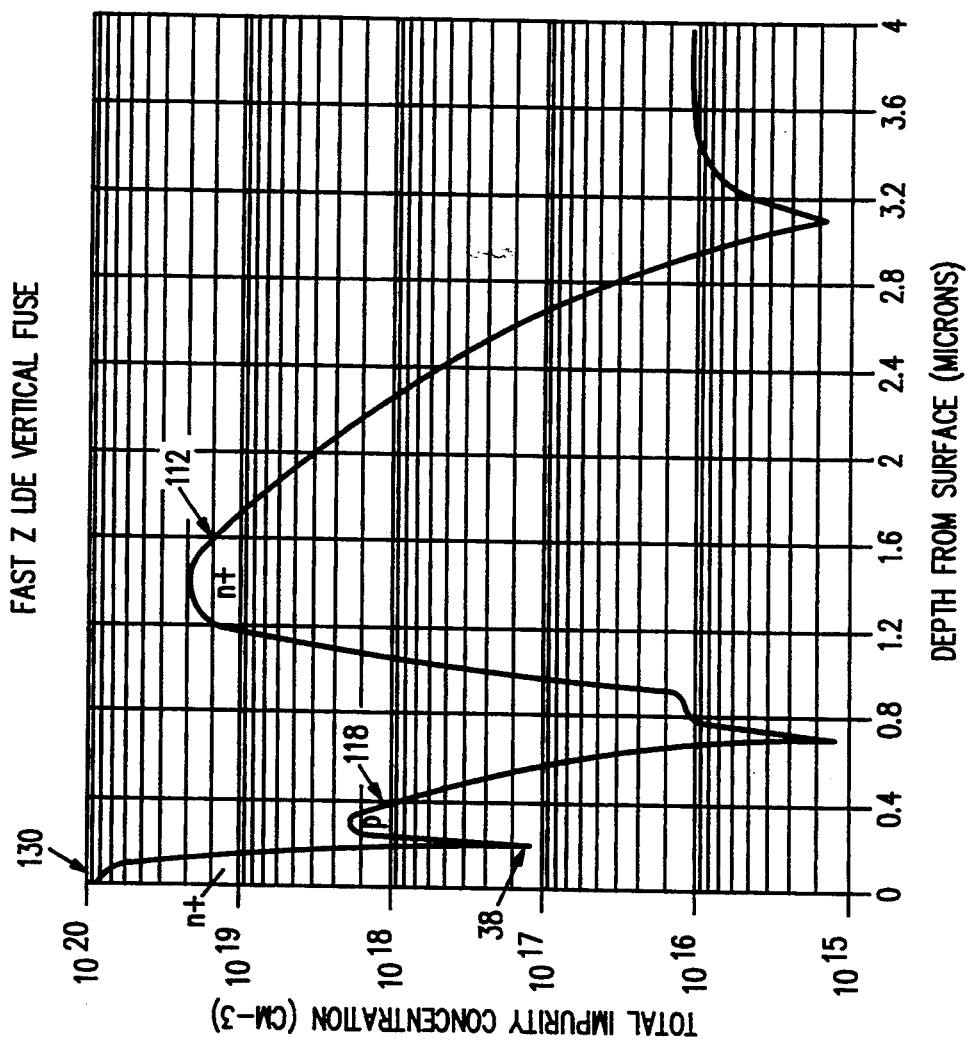
FIG. 12 is a graphic illustrating the relationship a of dopant concentration as a function of depth below the silicon surface of the structure illustrated in FIG. 11.

FIG. 12 is a graph illustrating the relationship of a dopant concentration as a function of depth below the silicon surface through the emitter 130, base 118, collector 112, and substrate 110. As shown at the surface 128 of emitter 130, arsenic dopants predominate with a chemical concentration of about $8 \times 10^{19}$ atoms per cubic centimeter. At the emitter-base junction 138, the emitter concentration has fallen to less than $2 \times 10^{17}$ atoms per cubic centimeter. The P type base dopants dominate the N type emitter dopants from about 0.21 microns into the structure to about 0.67 microns. The maximum doping for the base is about $2 \times 10^{18}$ atoms per cubic centimeter at a depth of about 0.22 microns. At or about 0.67 microns into the structure, the dopant concentration of collector 112 dominates. This reflects the upward diffusion of the collector dopants into the epitaxial layer by about 0.3 microns during the oxidation process used to form first and second field oxide regions 121 and 122. The collector dopants continue to dominate to a depth of about 3 microns, thereafter reaching the dopants for the substrate 110. About 0.15 microns of N-epitaxial growth lies under the base, before the upward diffusion of the N+buried layer.

Figure 13:
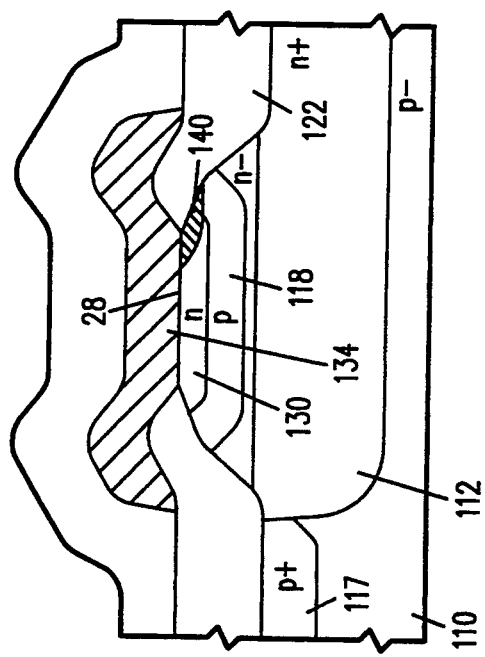
FIG. 13 is a cross section of a programmed fuse illustrating a shorted emitter/base junction.

FIG. 13 is a cross section of the emitter 130, base 118, and buried layer 112 illustrating a fusing action of the structure of FIG. 11. Before blowing the fuse, the structure of FIG. 11, using the dimensions and dopant concentration specified, has an emitter-collector breakdown voltage of about 3.5 volts and a collector-emitter breakdown voltage of about 19 volts. Applying a current or voltage pulse to the emitter in an emitter-collector breakdown mode programs the structure. For programming, in one example, the current will be about 45 milliamps for about 2.7 microseconds, with a resulting energy of 1.35 microJoules and a power of about 360 milliwatts. In the preferred embodiment, this pulse will be a ramped pulse from 0 to 6.3 volts in about 500 nanoseconds. Again, fusing action in not completely understood, but it is believed that in some embodiments that, as a result of the pulse, heating the interface between metal 34 and silicon 30 to its eutectic melting point of about 555° C. allows rapid dissolution of the silicon into the metal. This dissolution leaves behind a void which mass transport of the metal fills. The result is an ohmic contact 140 which extends through the emitter-base junction 138 to short metal contact 135 to base 118. A series resistance of the programmed fuse is less, therefore programming equipment detects a voltage drop upon formation of the ohmic contact. Detecting this voltage drop stops the programming pulse. After programming, the collector-base breakdown voltage will be about 24 volts. At 100 microamps the forward voltage will be 0.87 volts, and the series resistance will be 115 ohms.

FIG. 7 illustrates an array of fuses having selected fuses programmed. Floating base transistors represent the unprogrammed fuses and collector-base diodes represent the programmed fuses. Appropriate well known circuitry coupled to the word and bit lines of the array in FIG. 7 will detect the programmed ("1") and unprogrammed ("0") fuses. This circuitry can then interpret and supply to other circuitry suitable signals indicative of the "1" or "0" detected.

The vertical fuse having an embodiment of the present invention is particularly good because it employs a low dose emitter without P type enhancement to provide lower programming currents, higher collector-emitter and collector-base breakdown voltages, and lower collector-base capacitance. By virtue of the lightly doped shallow emitter, the emitter has a small volume, requiring only a low programming current. The lower power allows faster programming, an important advantage for large arrays. In tests, heat treatments of 450° C. for 60 minutes show no evidence of prematurely causing the aluminum contact 35 to initiate an ohmic contact through the shallow emitter 30. The wider base width helps prevent overblowing the fuse. Life tests of programmed fuses at 200° C. for 9 days does not cause any appreciable increase in series resistance.

The implanted emitter on the fuse is more controllable and reliable than the diffused emitters of the prior art. The implantation of the emitter with a light dose of dopant increases an emitter resistance and helps retain heat near the metal/silicon interface, facilitating lower programming power. Additionally, because of lower emitter injection efficiency and lower base transport factor, the vertical fuse described above displays a higher $BV_{eco}$ and $BV_{eco}$ than the prior art. The higher voltages prevent unwanted parasitic leakage between adjacent word lines within an array.

VI. Conclusion

In the above description of the invention, many details explain the invention and describe exemplary embodiments. Ascertaining the scope of the present invention results from review of the appended claims.

What is claimed is:

1. A semiconductor structure, comprising:
   a bipolar junction transistor; and
   a vertical fuse, with
   said bipolar junction transistor and said vertical fuse each comprising;
   a collector region having a first conductivity type;
   a base region overlying a first portion of said collector region and having a second conductivity type;
   an emitter region overlying said base region and having said first conductivity type;
   a polysilicon layer overlying said emitter region and a second portion of said collector region;
   a silicide layer overlying said polysilicon layer;
   a contact metal over said silicide layer overlying said emitter region and said second portion of said collector region, said contact metal contacting a first portion of said silicide layer over said emitter region of said vertical fuse; and a barrier metal separating said contact metal from a second portion of said silicide layer over said second portion of said collector region of said vertical fuse and separating said contact metal from said silicide layer over said bipolar junction transistor.

2. The semiconductor structure of claim 1 wherein said first conductivity type is N conductivity type and said second conductivity type is P conductivity type.

3. The semiconductor structure of claim 1 wherein said contact metal comprises aluminum.

4. The semiconductor structure of claim 1 wherein said barrier metal comprises titanium tungsten.

5. The semiconductor structure of claim 1 wherein said contact metal is in diffusible communication with said emitter region of said vertical fuse.

6. The semiconductor structure of claim 1 wherein processing of the structure results in diffusion of said contact metal to an interface between said polysilicon layer and said emitter region of said vertical fuse.

7. The semiconductor structure of claim 3 wherein said polysilicon layer has columnar grain boundaries having an average diameter of about 200 Å.

8. The semiconductor structure of claim 1 wherein said base region has an active chemical dopant concentration of about $1 \times 10^{18}$ atoms/cm$^3$.

9. The semiconductor structure of claim 1 wherein said base region has a thickness of about 0.3 microns to about 0.4 microns.

10. The semiconductor structure of claim 1 further comprising a substrate of said second conductivity type and wherein said collector region is buried in said substrate.

11. The semiconductor structure of claim 1 wherein the vertical fuse has a $\beta$ less than about 10, a $BV_{eco}$ in a range of about 3.0 volts to less than about 4.0 volts, and a $BV_{ceo}$ greater than about 8 volts.

12. The semiconductor structure of claim 1 wherein said contact metal is in diffusible communication with said polysilicon layer over said emitter region of said vertical fuse.

13. The semiconductor structure of claim 12 wherein said contact metal comprises aluminum.

14. The semiconductor structure of claim 12 wherein said contact metal comprises aluminum, silicon, and copper.

15. The semiconductor structure of claim 13 wherein said silicide layer comprises a PtSi region between said contact metal and said polysilicon layer.

16. The semiconductor structure of claim 14 wherein said contact metal has a ratio of said aluminum in a range of about 93.5% to about 100%, said silicon in a range of about 0.5% to about 0.9%, and said copper in a range of about 0% to about 5%.

17. The semiconductor structure of claim 1 wherein said vertical fuse is on a common substrate with said bipolar junction transistor.

18. The semiconductor structure of claim 1 wherein said bipolar junction transistor and said vertical fuse each further comprise a TiSi$_2$ region overlying a portion of said polysilicon layer overlying said emitter region.

19. An NPN conductivity type vertical fuse semiconductor structure comprising:

a P conductivity type silicon substrate of monocrystalline silicon;

a layer of N conductivity type epitaxial monocrystalline silicon overlying said substrate;

an N conductivity type collector region buried in said substrate and up diffused into said epitaxial layer, said collector region having an active chemical dopant of arsenic atoms and a sink region provided in said epitaxial layer extending from said collector region to a surface of said epitaxial layer;

a P conductivity type base region provided in said epitaxial layer and overlying said collector region and surrounded by silicon dioxide isolating said sink region, said base region having an active chemical dopant of phosphorous atoms with a concentration of about $5 \times 10^{17}$ to about $5 \times 10^{18}$ atoms/cm$^3$;

an N conductivity type emitter region overlying said base region formed in said monocrystalline silicon epitaxial layer;

a layer of polycrystalline silicon overlying said emitter and said sink regions and providing an interface surface between said monocrystalline silicon epitaxial layer and said polycrystalline silicon layer, said polycrystalline silicon layer having a plurality of grain boundaries and being heavily doped with a plurality of N conductivity type dopants; and a first and a second electrical contact comprising aluminum and overlying said polycrystalline silicon layer, said first electrical contact disposed in diffusible communication with said emitter region and forming a bit line for the vertical fuse, and said second electrical contact in electrical communication with said collector region through said sink region to provide a word line for the vertical fuse.

20. The vertical fuse of claim 19 wherein said diffusible communication between said first electrical contact and said emitter region comprises:

an oxide layer with an aperture overlying said polycrystalline silicon layer over said emitter region; and a refractory metal silicide overlying said polycrystalline silicon layer through said aperture so that said first electrical contact directly contacts said refractory metal silicide.

21. The vertical fuse of claim 19 wherein said diffusible communication between said first electrical contact and said emitter region comprises:

a first refractory metal silicide layer having a contact hole overlying said polycrystalline silicon overlying said emitter region;

a second refractory metal silicide layer formed within said contact hole; and wherein said first electrical contact is disposed directly on said second refractory metal silicide.

22. The vertical fuse of claim 21 wherein said first refractory metal silicide comprises titanium silicide and said second refractory metal silicide comprises platinum silicide.

23. A semiconductor structure which forms part of a vertical fuse comprising:

a layer of polycrystalline material overlying first and second doped active regions of the semiconductor structure;

a layer of reacted refractory material overlying said polycrystalline layer and overlying said first and second doped active regions;

a barrier metal layer overlying said reacted refractory metal which overlies said first doped active region and not overlying at least a selected portion of said refractory metal layer which overlies said second doped active region; and a contact metal overlying said selected portion of said reacted refractory metal layer.

24. The connection of claim 23 wherein said contact metal comprises aluminum.

25. The connection of claim 23 wherein said reacted refractory metal layer comprises platinum silicide.

26. A vertical fuse semiconductor structure comprising:
- a buried N conductivity type collector region;
- an overlying P conductivity type base region surrounded by silicon dioxide and extending about 0.45 microns above the collector region;
- an emitter region formed atop the base region and extending to a surface, the emitter having a dopant concentration of less than about $8 \times 10^{19}$ atoms of arsenic per cubic centimeter at the surface and extending about 0.2 microns to the base region; and
- an electrical contact deposited on the surface of the emitter region comprising about 95% aluminum, 4% copper, and 1% silicon.

27. An NPN conductivity type vertical fuse semiconductor structure comprising:
- a P conductivity type silicon substrate;
- an N conductivity type collector region buried in the substrate by an epitaxial growth of about 1.1 microns thick, said epitaxial growth having a top surface;
- a first region of said epitaxial growth doped with and N conductivity type dopant to provide a collector sink having a contact surface;
- a second region of said epitaxial growth provided for formation of a base region and an emitter region;
- said first and second regions of said epitaxial growth encircled by a first field oxide and isolated from one another by a second field oxide;
- said base region overlying said substrate and formed by providing an excess of P conductivity type dopants in said epitaxial growth to a depth of about 0.67 microns from said top surface; and
- said emitter region formed in said base region by providing an excess of N conductivity type dopants extending from said top surface to a depth of about 0.21 microns, said emitter having an active chemical dopant concentration of less than $8 \times 10^{19}$ atoms of arsenic per cubic centimeter at an interface between said base region and said emitter region.

28. The semiconductor structure of claim 19 further comprising a barrier metal separating said second electrical contact from said sink region.

29. An NPN conductivity type vertical fuse semiconductor structure comprising:
- a P conductivity type silicon substrate;
- an N conductivity type collector region buried in the substrate;
- an overlying P conductivity type base region with a surface;
- an N conductivity type emitter region formed in the base region and extending to the surface of the base region the emitter region having an active chemical dopant concentration of less than about $8 \times 10^{19}$ atoms of arsenic per cubic centimeter at the surface; and
- a metal contact on the surface of the emitter region comprising about 95% aluminum, 4% copper, and 1% silicon.

30. An NPN conductivity type vertical fuse semiconductor structure comprising:
- a P conductivity type silicon substrate;
- an N conductivity type collector region;
- an overlying P conductivity type base region with a thickness of about 0.45 microns; and
- an N conductivity type emitter region formed in the base region and extending about 0.2 microns into the base region, the emitter region having an active chemical impurity concentration of less than about $8 \times 10^{19}$ atoms of arsenic per cubic centimeter at the surface.

31. A codiffused semiconductor structure, comprising:
- a collector region of a first conductivity type;
- a base region of a second conductivity type overlying said collector region;
- an emitter region of said first conductivity type overlying said base region;
- a layer of polysilicon overlying said emitter region and a portion of said collector region and having dopants of both first and second types, said base region comprising dopants of said second conductivity type diffused from said polysilicon layer;
- a refractory metal silicide formed over parts of the semiconductor structure, a portion of said refractory metal silicide overlying said emitter region comprising platinum silicide;
- a barrier metal overlying selected areas of said refractory metal silicide but not over said platinum silicide portion; and
- a plurality of metal atoms contacting said platinum silicide.

32. A semiconductor structure connection, comprising:
- a layer of polycrystalline material, wherein said layer of polycrystalline material has a plurality of columnar grain boundaries having an average diameter of about 200 Å;
- a layer of reacted refractory metal overlying a selected area of said polycrystalline layer;
- a barrier metal layer overlying a first portion of said reacted refractory metal layer and not overlying a second portion of said reacted refractory metal layer; and
- a contact metal overlying said second portion, wherein said contact metal comprises aluminum.

33. A semiconductor structure connection, comprising:
- a layer of polycrystalline material having a plurality of columnar grain boundaries having an average diameter of about 200 Å;
- a layer of reacted refractory metal overlying a selected area of said polycrystalline layer;
- a barrier metal layer overlying a first portion of said reacted refractory metal layer and not overlying a second portion of said reacted refractory metal layer; and
- a contact metal layer comprising aluminum overlying said second portion and overlying said barrier metal layer.

34. A semiconductor structure connection, comprising:
- a layer of polycrystalline material having a plurality of columnar grain boundaries;
- a layer of reacted refractory metal overlying a selected area of said polycrystalline layer;
- a barrier metal layer overlying a first portion of said reacted refractory metal layer and not overlying a second portion of said reacted refractory metal layer; and
- a contact metal layer overlying said second portion and overlying said barrier metal layer.

* * * * *